US009551938B2

(12) United States Patent
Matsuyama et al.

(10) Patent No.: US 9,551,938 B2
(45) Date of Patent: Jan. 24, 2017

(54) LIGHT SOURCE OPTIMIZING METHOD, EXPOSURE METHOD, DEVICE MANUFACTURING METHOD, PROGRAM, EXPOSURE APPARATUS, LITHOGRAPHY SYSTEM, LIGHT SOURCE EVALUATION METHOD, AND LIGHT SOURCE MODULATION METHOD

(75) Inventors: Tomoyuki Matsuyama, Kitakatsushika-gun (JP); Naonori Kita, Saitama (JP)

(73) Assignee: NIKON CORPORATION, Tokyo (JP)

( * ) Notice: Subject to any disclaimer, the term of this patent is extended or adjusted under 35 U.S.C. 154(b) by 1074 days.

(21) Appl. No.: 13/366,829

(22) Filed: Feb. 6, 2012

(65) Prior Publication Data

US 2012/0133915 A1    May 31, 2012

Related U.S. Application Data

(63) Continuation of application No. PCT/JP2011/000813, filed on Feb. 14, 2011.

(30) Foreign Application Priority Data

Feb. 20, 2010   (JP) ................. 2010-035476

(51) Int. Cl.
  *G03B 27/68*  (2006.01)
  *G03F 7/20*   (2006.01)

(52) U.S. Cl.
  CPC ........... *G03F 7/70116* (2013.01); *G03F 7/705* (2013.01); *G03F 7/70125* (2013.01); *G03F 7/70625* (2013.01)

(58) Field of Classification Search
  CPC .. G03F 7/70116; G03F 7/70125; G03F 7/705; G03F 7/70625
  (Continued)

(56) References Cited

U.S. PATENT DOCUMENTS

| | | | |
|---|---|---|---|
| 5,312,513 A | 5/1994 | Florence et al. | |
| 5,448,332 A | 9/1995 | Sakakibara et al. | |

(Continued)

FOREIGN PATENT DOCUMENTS

| | | |
|---|---|---|
| EP | 0 779 530 A1 | 6/1997 |
| EP | 1 420 298 A2 | 5/2004 |

(Continued)

OTHER PUBLICATIONS

Mar. 22, 2011 International Search Report issued in International Patent Application No. PCT/JP2011/000813.

(Continued)

*Primary Examiner* — Deoram Persaud
(74) *Attorney, Agent, or Firm* — Oliff PLC

(57) ABSTRACT

Disclosed is a light source optimizing method wherein: a light source shape obtained as the result of SMO is set as a target, the SMO being an optimizing calculation method for optimizing a mask pattern and illumination light source, a spatial light modulator is controlled such that a deviation from the target is within an acceptable range, and the shape of the illumination light source is set; the image of the pattern obtained as the results of the SMO is formed on a wafer, using illumination light emitted from the illumination light source having the set light source shape, an OPE is evaluated as image-forming performance using the detection results obtained by detecting the image of the pattern thus formed; and the light source shape is optimized.

38 Claims, 12 Drawing Sheets

(58) Field of Classification Search
USPC .................................................. 355/67, 52
See application file for complete search history.

(56) References Cited

U.S. PATENT DOCUMENTS

| | | | |
|---|---|---|---|
| 5,646,413 | A | 7/1997 | Nishi |
| 5,969,441 | A | 10/1999 | Loopstra et al. |
| 6,208,407 | B1 | 3/2001 | Loopstra |
| 6,452,662 | B2 | 9/2002 | Mulkens et al. |
| 6,563,566 | B2 | 5/2003 | Rosenbluth et al. |
| 6,590,634 | B1 | 7/2003 | Nishi et al. |
| 6,611,316 | B2 | 8/2003 | Sewell |
| 6,671,035 | B2 | 12/2003 | Eurlings et al. |
| 6,885,493 | B2 | 4/2005 | Ljungblad et al. |
| 6,891,655 | B2 | 5/2005 | Grebinski et al. |
| 6,900,915 | B2 | 5/2005 | Nanjyo et al. |
| 6,913,373 | B2 | 7/2005 | Tanaka et al. |
| 7,023,610 | B2 | 4/2006 | Ohtsuki et al. |
| 7,095,546 | B2 | 8/2006 | Mala et al. |
| 7,265,816 | B2 | 9/2007 | Tsuji |
| 7,589,822 | B2 | 9/2009 | Shibazaki |
| 2002/0041377 | A1 | 4/2002 | Hagiwara et al. |
| 2005/0095749 | A1 | 5/2005 | Krellmann et al. |
| 2006/0158633 | A1* | 7/2006 | Mackey ............. G03F 7/70158 355/67 |
| 2006/0170901 | A1 | 8/2006 | Tanitsu et al. |
| 2007/0146676 | A1 | 6/2007 | Tanitsu et al. |
| 2007/0165202 | A1* | 7/2007 | Koehler ................. G03F 7/702 355/67 |
| 2008/0158529 | A1* | 7/2008 | Hansen ................. G03F 1/144 355/53 |
| 2009/0073411 | A1 | 3/2009 | Tanitsu |
| 2009/0091730 | A1* | 4/2009 | Tanaka ............... G03F 7/70291 355/67 |
| 2009/0097007 | A1 | 4/2009 | Tanaka |
| 2009/0097094 | A1 | 4/2009 | Tanaka |
| 2009/0109417 | A1 | 4/2009 | Tanitsu |
| 2009/0128886 | A1 | 5/2009 | Hirota |
| 2009/0231562 | A1 | 9/2009 | Yoshii et al. |
| 2010/0321661 | A1* | 12/2010 | Natt ................... G03F 7/70091 355/67 |
| 2011/0001956 | A1* | 1/2011 | Kawanami .......... G03F 7/70258 355/77 |

FOREIGN PATENT DOCUMENTS

| | | |
|---|---|---|
| EP | 1 798 758 A1 | 6/2007 |
| JP | 2006059834 A | 3/2006 |
| JP | 2007-142215 A | 6/2007 |
| JP | A-2009-111223 | 5/2009 |
| JP | A-2009-117801 | 5/2009 |
| JP | A-2009-117812 | 5/2009 |
| JP | 2009194107 A | 8/2009 |
| JP | A-2010-34486 | 2/2010 |
| WO | WO 01/35168 A1 | 5/2001 |
| WO | WO 2004/055803 A1 | 7/2004 |
| WO | 2009/035129 A2 | 3/2009 |

OTHER PUBLICATIONS

Mar. 22, 2011 Written Opinion of the International Searching Authority issued in International Patent Application No. PCT/JP2011/000813 (with Translation).

Mar. 3, 2015 Office Action issued in Japanese Application No. 2012-500497.

Apr. 20, 2016 Office Action issued in Japanese Patent Application No. 2015-077395.

Sep. 23, 2016 Office Action issued in Japanese Patent Application No. 2015-077395.

* cited by examiner

TARGET PATTERN

- Dark
- Bright
- Edge Slope

LIGHT SOURCE SHAPE

MASK PATTERN
(TRANSMITTANCE
DISTRIBUTION)

0 ▬▬▬ 1

MASK PATTERN
(PHASE SHIFT
DISTRIBUTION)

$-\pi$ ▬▬▬ $\pi$

PROJECTION IMAGE
($\Delta Z = 0$ nm)

PROJECTION IMAGE
($\Delta Z = 50$ nm)

PROJECTION IMAGE
($\Delta Z = 100$ nm)

Fig. 10

| | Fringe Zernike Functions |
|---|---|
| Z1 | 1 |
| Z2 | $\rho \cos\theta$ |
| Z3 | $\rho \sin\theta$ |
| Z4 | $2\rho^2 - 1$ |
| Z5 | $\rho^2 \cos 2\theta$ |
| Z6 | $\rho^2 \sin 2\theta$ |
| Z7 | $(3\rho^3 - 2\rho) \cos\theta$ |
| Z8 | $(3\rho^3 - 2\rho) \sin\theta$ |
| Z9 | $6\rho^4 - 6\rho^2 + 1$ |
| Z10 | $\rho^3 \cos 3\theta$ |
| Z11 | $\rho^3 \sin 3\theta$ |
| Z12 | $(4\rho^4 - 3\rho^2) \cos 2\theta$ |
| Z13 | $(4\rho^4 - 3\rho^2) \sin 2\theta$ |
| Z14 | $(10\rho^5 - 12\rho^3 + 3\rho) \cos\theta$ |
| Z15 | $(10\rho^5 - 12\rho^3 + 3\rho) \sin\theta$ |
| Z16 | $20\rho^6 - 30\rho^4 + 12\rho^2 - 1$ |
| Z17 | $\rho^4 \cos 4\theta$ |
| Z18 | $\rho^4 \sin 4\theta$ |
| Z19 | $(5\rho^5 - 4\rho^3) \cos 3\theta$ |
| Z20 | $(5\rho^5 - 4\rho^3) \sin 3\theta$ |
| Z21 | $(15\rho^6 - 20\rho^4 + 6\rho^2) \cos 2\theta$ |
| Z22 | $(15\rho^6 - 20\rho^4 + 6\rho^2) \sin 2\theta$ |
| Z23 | $(35\rho^7 - 60\rho^5 + 30\rho^3 - 4\rho) \cos\theta$ |
| Z24 | $(35\rho^7 - 60\rho^5 + 30\rho^3 - 4\rho) \sin\theta$ |
| Z25 | $70\rho^8 - 140\rho^6 + 90\rho^4 - 20\rho^2 + 1$ |
| Z26 | $\rho^5 \cos 5\theta$ |
| Z27 | $\rho^5 \sin 5\theta$ |
| Z28 | $(6\rho^6 - 5\rho^4) \cos 4\theta$ |
| Z29 | $(6\rho^6 - 5\rho^4) \sin 4\theta$ |
| Z30 | $(21\rho^7 - 30\rho^5 + 10\rho^3) \cos 3\theta$ |
| Z31 | $(21\rho^7 - 30\rho^5 + 10\rho^3) \sin 3\theta$ |
| Z32 | $(56\rho^8 - 105\rho^6 + 60\rho^4 - 10\rho^2) \cos 2\theta$ |
| Z33 | $(56\rho^8 - 105\rho^6 + 60\rho^4 - 10\rho^2) \sin 2\theta$ |
| Z34 | $(126\rho^9 - 280\rho^7 + 210\rho^5 - 60\rho^3 + 5\rho) \cos\theta$ |
| Z35 | $(126\rho^9 - 280\rho^7 + 210\rho^5 - 60\rho^3 + 5\rho) \sin\theta$ |
| Z36 | $252\rho^{10} - 630\rho^8 + 560\rho^6 - 210\rho^4 + 30\rho^2 - 1$ |
| Z37 | $924\rho^{12} - 2772\rho^{10} + 3150\rho^8 - 1680\rho^6 + 420\rho^4 - 42\rho^2 + 1$ |

Fig. 11

| Number | Pupil Distortion | Number | Pupil Distortion |
|---|---|---|---|
| Dist-1 | Z1*DX | Dist-31 | Z15*DX + Z14*DY |
| Dist-2 | Z1*DY | Dist-32 | Z19*DX + Z20*DY |
| Dist-3 | Z2*DX + Z3*DY | Dist-33 | Z20*DX - Z19*DY |
| Dist-4 | Z2*DX - Z3*DY | Dist-34 | Z19*DX - Z20*DY |
| Dist-5 | Z3*DX + Z2*DY | Dist-35 | Z20*DX + Z19*DY |
| Dist-6 | Z4*DX | Dist-36 | Z26*DX + Z27*DY |
| Dist-7 | Z4*DY | Dist-37 | Z27*DX - Z26*DY |
| Dist-8 | Z5*DX + Z6*DY | Dist-38 | Z16*DX |
| Dist-9 | Z6*DX - Z5*DY | Dist-39 | Z16*DY |
| Dist-10 | Z5*DX - Z6*DY | Dist-40 | Z21*DX + Z22*DY |
| Dist-11 | Z6*DX + Z5*DY | Dist-41 | Z22*DX - Z21*DY |
| Dist-12 | Z7*DX + Z8*DY | Dist-42 | Z21*DX - Z22*DY |
| Dist-13 | Z7*DX - Z8*DY | Dist-43 | Z22*DX + Z21*DY |
| Dist-14 | Z8*DX + Z7*DY | Dist-44 | Z28*DX + Z29*DY |
| Dist-15 | Z10*DX + Z11*DY | Dist-45 | Z29*DX - Z28*DY |
| Dist-16 | Z11*DX - Z10*DY | Dist-46 | Z23*DX + Z24*DY |
| Dist-17 | Z10*DX - Z11*DY | Dist-47 | Z23*DX - Z24*DY |
| Dist-18 | Z11*DX + Z10*DY | Dist-48 | Z24*DX + Z23*DY |
| Dist-19 | Z9*DX | Dist-49 | Z30*DX + Z31*DY |
| Dist-20 | Z9*DY | Dist-50 | Z31*DX - Z30*DY |
| Dist-21 | Z12*DX + Z13*DY | Dist-51 | Z25*DX |
| Dist-22 | Z13*DX - Z12*DY | Dist-52 | Z25*DY |
| Dist-23 | Z12*DX - Z13*DY | Dist-53 | Z32*DX + Z33*DY |
| Dist-24 | Z13*DX + Z12*DY | Dist-54 | Z33*DX - Z32*DY |
| Dist-25 | Z17*DX + Z18*DY | Dist-55 | Z34*DX + Z35*DY |
| Dist-26 | Z18*DX - Z17*DY | | |
| Dist-27 | Z17*DX - Z18*DY | | |
| Dist-28 | Z18*DX + Z17*DY | | |
| Dist-29 | Z14*DX + Z15*DY | | |
| Dist-30 | Z14*DX - Z15*DY | | |

LIGHT SOURCE OPTIMIZING METHOD, EXPOSURE METHOD, DEVICE MANUFACTURING METHOD, PROGRAM, EXPOSURE APPARATUS, LITHOGRAPHY SYSTEM, LIGHT SOURCE EVALUATION METHOD, AND LIGHT SOURCE MODULATION METHOD

CROSS-REFERENCE TO RELATED APPLICATIONS

This application is a continuation of International Application PCT/JP2011/000813, with an international filing date of Feb. 14, 2011, the disclosure of which is hereby incorporated herein by reference in its entirety, which was not published in English.

BACKGROUND OF THE INVENTION

Field of the Invention

The present invention relates to light source optimizing methods, exposure methods, device manufacturing methods, programs, exposure apparatuses, lithography systems, light source evaluation methods, and light source modulation methods, and more particularly to a light source optimizing method to optimize a shape of an illumination light source which is used to form a pattern on an object, an exposure method using the light source optimizing method, a device manufacturing method using the exposure method, a program which makes a computer used for control of an exposure apparatus execute a processing to optimize a shape of an illumination light source, an exposure apparatus which irradiates an illumination light to form a pattern on an object, a lithography system which includes the exposure apparatus, a light source evaluation method suitable to optimize a shape of an illumination light source, and a light source modulation method to modulate a luminance distribution of an illumination light source.

Description of the Background Art

With finer device patterns, projection exposure apparatuses used to manufacture semiconductor devices and the like, as in a so-called stepper or a so-called scanning stepper (also called a scanner), have come to require high resolution. Resolution R is expressed in the Rayleigh equation, that is, $R=k_1 (\lambda/NA)$. Here, $\lambda$ is the wavelength of a light source (illumination light), NA is the numerical aperture of a projection optical system, and $k_1$ is the process factor determined by resolvability and/or process controllability of a resist. Because of this, conventionally, attempts have been made to improve resolution by making wavelength $\lambda$ of the illumination light shorter and making the numerical aperture of the projection optical system larger (higher NA). However, because pursuing shorter exposure wavelengths present difficulties when developing light sources and glass material, and higher NA reduces the depth of focus (DOF) of the projection optical system which degrades the image-forming performance (image-forming characteristics), higher NA cannot be pursued more than is necessary.

Due to such reasons described above, only shortening the wavelength of wavelength $\lambda$ of the illumination light and increasing the numerical aperture (higher NA) of the projection optical system were not enough to keep up with finer circuit patterns and sizes. Therefore, efforts were put into improving the lithography performance (lower $k_1$) by using modified illumination technology such as annular illumination in an exposure apparatus, introducing technology such as phase-shift mask for extending the limits of optical lithography, and in resist technology, by developing raw materials and using process development technologies such as thinner film formation and multiple layer formation.

In recent years, as a means of further realizing higher NA, an exposure apparatus is put to practice which employs a local liquid immersion exposure technology, however, also in the liquid immersion exposure apparatus, because there are limitations not only to a shorter wavelength of wavelength $\lambda$ of the illumination light but also to a higher NA, a lower $k_1$ has become absolutely essential. With lower $k_1$ in recent years, not only are super-resolution technologies such as modified illumination and phase-shift technology used, but also optical proximity effect correction (OPC: Optical Proximity Correction) requires consideration, where degradation in a pattern fidelity which occurs due to an optical system error such as aberration or when a reticle pattern is transferred onto a wafer is corrected, using a reticle pattern. However, because lower $k_1$ reduces the contrast of the pattern image, this point also needs attention.

Under such background, to provide an optical imaging solution which allows mass-production at a low $k_1$ value, SMO (Source and Mask Optimization) in which a pattern of a mask (reticle) and an illumination light source are simultaneously optimized by an optical model is recently gathering attention. SMO is disclosed, for example, in U.S. Pat. No. 6,563,566 and the like. Light source intensity distribution output from SMO is realized, for example, by a spatial light modulator (SLM: Spatial Light Modulator) disclosed in U.S. Patent Application Publication No. 2009/0097094 and the like.

However, between a target light source intensity distribution and the actual light source intensity distribution, a deviation occurs due to various kinds of errors. By this deviation, image-forming performance, especially optical proximity effect (OPE: Optical Proximity Effect) results differently from the target value (OPE error occurs). In the conventional image-forming optical system, parameters to correct the OPE errors were relatively simple as in the NA of a projection optical system, illumination σ, and annular ratio and the like. Therefore, it was relatively easy to perform the OPE matching.

However, the actual case is that it is difficult to perform an effective the OPE matching of a complicated illumination intensity distribution like an SMO solution with highly flexible parameters such as SML.

SUMMARY OF THE INVENTION

According to a first aspect of the present invention, there is provided a first light source optimizing method to optimize a light source shape which is a shape of an illumination light source used to form a pattern on an object, the method comprising: setting the light source shape so that deviation from a target falls within an acceptable range, the target being the light source shape obtained as a result of optimizing calculation to optimize a pattern and the illumination light source; evaluating an image-forming performance, by forming an image of a pattern decided by means of the optimizing calculation on the object using illumination light from the illumination light source having the light source shape which has been set and using a detection result of a detection of the image of the pattern that has been formed; and optimizing the light source shape based on an evaluation result of the image-forming performance.

According to this method, it becomes possible to set a light source shape optimal to the pattern.

According to a second aspect of the present invention, there is provided an exposure method comprising: transferring the pattern on an object by irradiating the illumination light from the illumination light source having a light source shape which has been optimized by the first light source optimizing method.

According to this method, it becomes possible to transfer a pattern onto an object with high resolution as well as with good accuracy.

According to a third aspect of the present invention, there is provided a device manufacturing method, comprising: forming a pattern on an object using the exposure method of the present invention; and developing the object on which the pattern is formed.

According to a fourth aspect of the present invention, there is provided a program that makes a computer controlling an exposure apparatus which irradiates an illumination light and forms a pattern on an object execute a processing of optimizing a light source shape which is a shape of an illumination light source generating the illumination light, the program making the computer execute: a setting procedure to set the light source shape so that a light source shape obtained as a result of optimizing calculation to optimize a pattern and the illumination light source serves as a target, and deviation from the target falls within an acceptable range; an evaluating procedure to evaluate an image-forming performance by forming an image of a pattern obtained as a result of the optimizing calculation on the object using illumination light from the illumination light source having the light source shape which has been set, and using a detection result of a detection of the image of the pattern that has been formed; and an optimizing procedure to optimize the light source shape based on an evaluation result of the image-forming performance.

According to this program, by installing the program into the computer, the computer performs processing according to the program, and as a consequence, it becomes possible to set an optimal light source shape with respect to the pattern.

According to a fifth aspect of the present invention, there is provided an exposure apparatus which irradiates an illumination light and forms a pattern on an object, the apparatus comprising: an illumination light source which generates the illumination light; a setting section which sets a light source shape which is a shape of the illumination light source; and a processing apparatus which sets the light source shape via the setting section so that light source shape obtained as a result of optimizing calculation to optimize a pattern and the illumination light source serves as a target, and deviation from the target falls within an acceptable range, evaluates an image-forming performance using a detection result of an image of the pattern obtained as a result of the optimizing calculation formed on the object using illumination light from the illumination light source whose light source shape is set, and optimizes the light source shape via the setting section based on an evaluation result of the image-forming performance.

According to this apparatus, it becomes possible to set an optimal light source shape with respect to the pattern, which in turn allows the pattern to be formed on the object with high resolution as well as with good accuracy.

According to a sixth aspect of the present invention, there is provided a lithography system, comprising: an exposure apparatus of the present invention; and a host apparatus which has control over the exposure apparatus.

According to a seventh aspect of the present invention, there is provided a light source evaluation method to evaluate a light source shape which is a shape of an illumination light source to form a pattern on an object, the method comprising: preparing a reference light source shape that has a predetermined intensity distribution; obtaining an intensity distribution of the light source shape; and calculating a coefficient of each term of a predetermined polynomial that expresses a modulation of the light source shape with respect to the reference light source shape by a least-squares method to be used when evaluating the light source shape. In this case, least-squares method includes both the linear least-squares method and the nonlinear least-squares method.

According to this method, it becomes possible to perform an accurate evaluation of the light source shape, without being influenced by the reference light source shape.

According to an eighth aspect of the present invention, there is provided a second light source optimizing method to optimize a light source shape which is a shape of an illumination light source to form a pattern on an object, the method comprising: calculating a coefficient of each term of the polynomial using the light source evaluation method of the present invention; obtaining a relation between a variation of an image-forming performance when forming an image of a pattern on the object using an illumination light from the illumination light source having the light source shape and the coefficient of each term of the polynomial; and optimizing the light source shape using the relation that has been obtained.

According to this method, it becomes possible to set an optimal light source shape with respect to the pattern.

According to a ninth aspect of the present invention, there is provided a light source modulation method to modulate a pupil luminance distribution which is a luminance distribution of an illumination light source used to form a pattern image on an object, the method comprising; expressing the pupil luminance distribution using a polynomial which expresses a modulation of the pupil luminance distribution; obtaining a variation of an image-forming performance for each of the modulated parameters, with an error corresponding to a minute variation of a modulated parameter included in the polynomial with respect to the design value of the pattern image serving as an evaluation index; and obtaining an additionally modulated value of the modulated parameter, using the variation of the image-forming performance obtained for each of the modulated parameters so that a deviation of the error with respect to the design value of the pattern image from the target value falls within an acceptable range.

According to this method, it becomes possible to precisely modulate the pupil luminance distribution to form a pattern image.

BRIEF DESCRIPTION OF THE DRAWINGS

In the accompanying drawings;

FIG. 10 is a table chart showing the Zernike polynomials (Zernike functions) which are employed as a first model in the OPE matching;

FIG. 11 is a table chart showing distortion functions which are employed as a second model in the OPE matching;

DESCRIPTION OF THE EMBODIMENTS

An embodiment is described below, referring to FIGS. 1 to 13.

Figure 1:
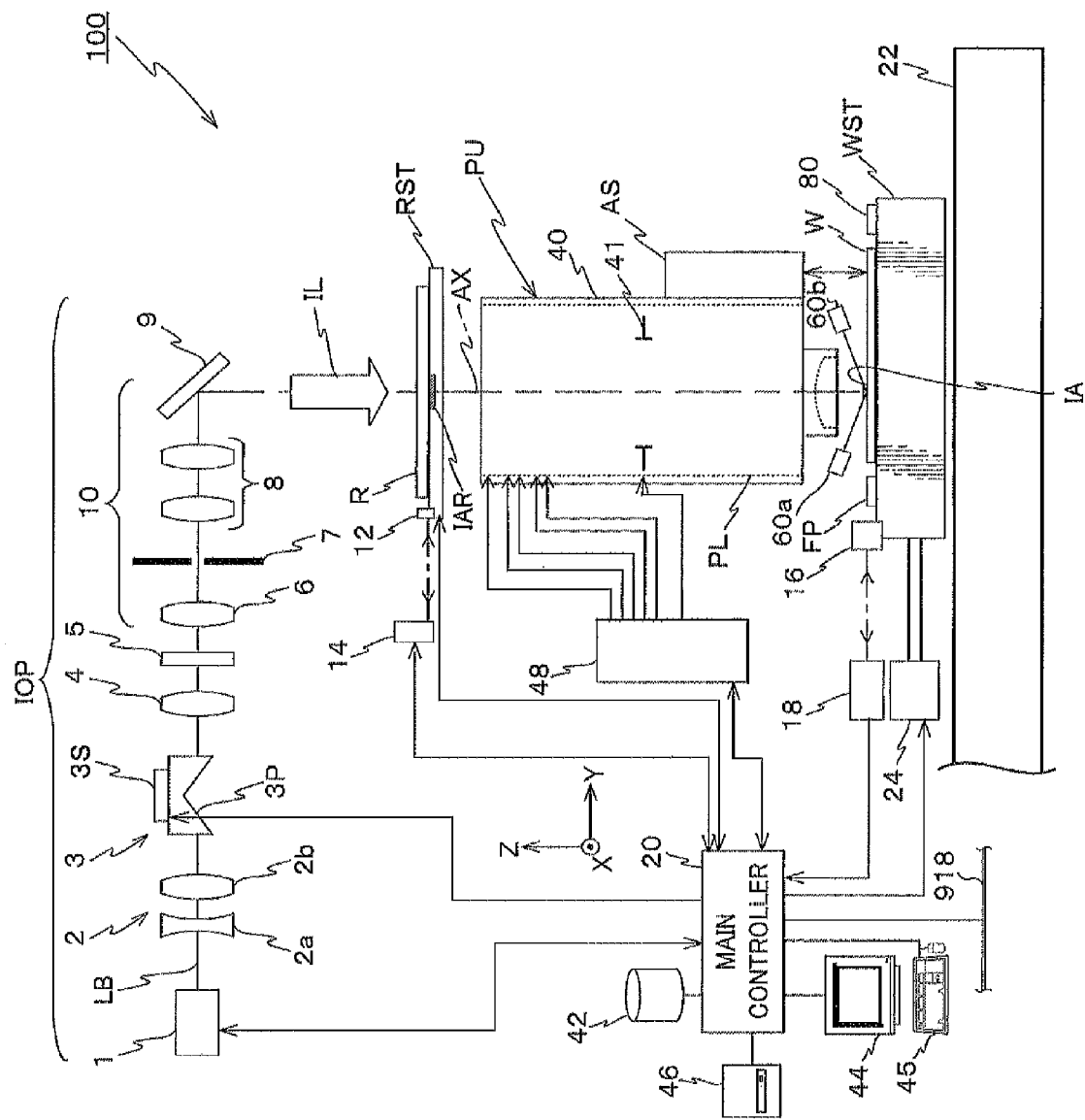
FIG. 1 is a view showing a schematic structure of an exposure apparatus related to an embodiment.

FIG. 1 shows a schematic structure of an exposure apparatus 100 related to the embodiment. Exposure apparatus 100 is a projection exposure apparatus based on a step-and-scan method, or a so-called scanner. As described later on, in the present embodiment, a projection optical system PL is provided, and in the description below, a direction parallel to an optical axis AX of projection optical system PL is described as a Z-axis direction, a scanning direction within a plane orthogonal to the Z-axis direction where a reticle and a wafer are relative scanned is described as a Y-axis direction, and a direction orthogonal to the Z-axis and Y-axis is described as an X-axis direction, and rotation (tilt) directions around the X-axis, Y-axis, and Z-axis will each be described as $\theta x$, $\theta y$, and $\theta z$ directions.

Exposure apparatus 100 is equipped with an illumination system IOP, a reticle stage RST which holds reticle R, a projection unit PU which projects an image of a pattern formed on reticle R onto a wafer W that is coated with a sensitive agent (resist), a wafer stage WST which holds wafer W, and a control system and the like for these parts.

Illumination system IOP includes a light source 1, and an illumination optical system including a beam expander 2, a spatial light modulating unit 3, a relay optical system 4, a fly-eye lens 5 serving as an optical integrator, a condenser optical system 6, an illumination field stop (reticle blind) 7, an image-forming optical system 8, and a bending mirror 9 and the like that are sequentially placed along an optical path of an optical beam LB emitted from light source 1.

As light source 1, as an example, an ArF excimer laser (output wavelength 193 nm) is to be used. Optical beam LB emitted from light source 1, as an example has a rectangular sectional shape which is elongated in the X-axis.

Beam expander 2 is structured with a concave lens 2a and a convex lens 2b. Concave lens 2a has a negative refracting power, and convex lens 2b has a positive refracting power, respectively.

Spatial light modulating unit 3 is equipped with a so-called K prism (hereinafter, simply referred to as a prism) 3P, and a reflection type spatial light modulator (SLM: Spatial Light Modulator) 3S placed on the upper surface (surface on the +Z side) of prism 3P. Prism 3P is made of optical glass such as fluorite, silica glass and the like.

Figure 2:
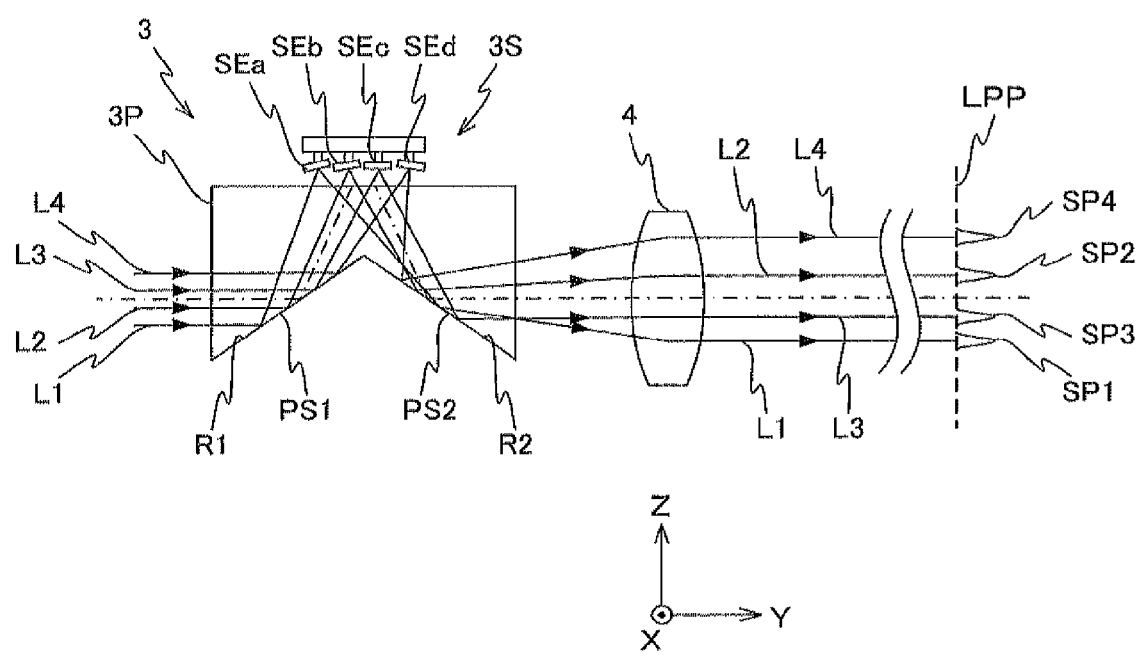
FIG. 2 is a view showing a structure of a spatial light modulating unit structuring an illumination system in FIG. 1.

As shown enlarged in FIG. 2, on the lower surface of prism 3P, namely on the opposite side of spatial light modulator 3S, a V shaped surface (a surface recessed in a wedge shape) is formed, consisting of surfaces PS1 and PS2 that intersect at an angle of 60 degrees with an incidence plane (−Y side surface) and an outgoing plane (+Y side surface) that are parallel to the X-Z plane in FIG. 2, respectively, and also intersect each other at an angle of 120 degrees. The rear surfaces (inner surface of prism 3P) of surfaces PS1 and PS2 each function as reflecting surfaces R1 and R2.

Reflecting surface R1 reflects light from beam expander 2 which is incident perpendicularly on an incidence plane of prism 3P and is parallel to the Y-axis to a direction of spatial light modulator 3S. Optical beam LB that has been reflected reaches spatial light modulator 3S via the upper surface of prism 3P, and is reflected toward reflecting surface R2 by spatial light modulator 3S as is described later on. Reflecting surface R2 of prism 3P reflects the light from spatial light modulator 3S that has reached reflecting surface R2 via the upper surface of prism 3P, and emits the light to the side of relay optical system 4.

Spatial light modulator 3S is a reflection type spatial light modulator. A spatial light modulator refers to a device which two-dimensionally controls the amplitude, phase, or propagation direction or the like of an incident light, and processes, displays, and deletes an image or spatial information such as patterned data. As spatial light modulator 3S of the present embodiment, a movable multi-mirror array is used which has a large number of microscopic mirror elements SE that are arrayed on a two-dimensional (XY) plane. Spatial light modulator 3S has a large number of mirror elements, however, in FIG. 2, only mirror elements SEa, SEb, SEc, and SEd among such mirror elements are shown. Spatial light modulator 3S has a large number of mirror elements SE, and drive sections of the same number that continuously tilt (rotate) the large number of mirror elements SE in a predetermined range around two axes (for example, the X-axis and the Y-axis) which are orthogonal within the XY plane. The drive section has, for example, a support which supports the center of the rear surface (surface on the +Z side, namely a surface on the opposite side of the reflecting surface) of mirror element SE, a substrate to which the support is fixed, four electrodes provided on the substrate, and four electrodes (not shown) provided on the rear surface of mirror element SE facing the electrodes on the substrate. Incidentally, a detailed structure and the like of a spatial light modulator similar to spatial light modulator 3S is disclosed, for example, in U.S. Patent Application Publication No. 2009/0097094.

Referring back to FIG. 1, fly-eye lens 5 is an assembly of a large number of microscopic lens elements that are arrayed densely in a perpendicular direction with respect to optical beam LB, having a positive refracting power. Incidentally, as fly-eye lens 5, a micro fly-eye lens formed with cylindrical lenses disclosed, for example, in U.S. Pat. No. 6,913,373 can be employed.

By illumination system IOP, optical beam LB emitted from light source 1 is incident on beam expander 2, and by passing through beam expander 2, the section of the beam is enlarged and is shaped into a light beam that has a predetermined rectangular cross section. Optical beam LB shaped by beam expander 2 is incident on spatial light modulating unit 3.

For example, as shown in FIG. 2, four rays L1-L4 mutually parallel and lined up in the Z-axis direction in optical beam LB, enter inside prism 3P from its incidence plane, and are mutually reflected in parallel toward spatial light modulator 3S by reflecting surface R1. And, rays L1-L4 are incident among a plurality of mirror elements SE on reflecting surfaces of different mirror elements SEa, SEb, SEc, and SEd, respectively, which are lined up in the Y-axis direction. Mirror elements SEa, SEb, SEc, and SEd herein are tilted independently by each of their drive sections (not shown). Because of this, rays L1-L4 are directed toward reflecting surface R2; however, each reflected in different directions. And, rays L1-L4 (optical beam LB) are reflected off reflecting surface R2, and are emitted outside prism 3P. An air equivalent optical path length for each of the rays L1-L4 from the −Y side surface (incidence plane) to the +Y side surface (outgoing plane) of prism 3P is set equal to an air equivalent optical path length corresponding to a case when prism 3P is not provided. The air equivalent optical path length herein is an optical path length L/n where an optical path length (L) of light in a medium (refractive index n) is converted into an optical path length in air (refractive index 1).

Rays L1-L4 (optical beam LB) emitted outside of prism 3P are arranged parallel to the Y-axis via relay optical system 4, and are incident on fly-eye lens 5 placed behind relay optical system 4. And, rays L1-L4 (optical beam LB) are split (wavefront splitting) into a plurality of (multiple) beams by (a large number of lens elements of) fly-eye lens 5. This forms a secondary light source (surface light source, namely an illumination light source) that consists of a plurality of light source images on a rear side focal plane LPP of fly-eye lens 5 which coincides with a pupil plane (illumination pupil plane) of the illumination optical system.

FIG. 2 typically shows light intensity distributions SP1-SP4 corresponding to rays L1-L4 on rear side focal plane LPP of fly-eye lens 5. In this manner, in the present embodiment, the light intensity distribution (also referred to as a luminance distribution or a light source shape) of the secondary light source (illumination light source) is set freely by spatial light modulator 3S. Incidentally, as the spatial light modulator, a reflection type active spatial light modulator described above, or a transmission type or a reflection type diffractive optical element serving as an inactive type spatial light modulator can be used. In the case of using such an inactive type spatial light modulator, by controlling the position or posture of at least a part of the optical members (lens, prism member and the like) that make up relay optical system 4, the light intensity distribution of the secondary light source (illumination light source) can be set variably. Further, as the diffractive optical element, as disclosed in, for example, U.S. Pat. Nos. 6,671,035, 7,265,816, and the like, by controlling the position of a diffractive optical element having a plurality of divided areas, the light intensity distribution of the secondary light source (illumination light source) can be set variably. Further, in addition to the active or inactive spatial light modulator described above, the light intensity distribution of the secondary light source (illumination light source) can be set variably using a movable illumination aperture stop disclosed in, for example, U.S. Pat. No. 6,452,662.

Incidentally, in the present embodiment, Koehler illumination is performed on reticle R held by reticle stage RST which will be described later, using the secondary ht source which fly-eye lens 5 forms as the illumination light source. Therefore, the surface on which the secondary light source is formed is a conjugate plane with respect to a surface (aperture stop plane) of an aperture stop 41 of projection optical system PL, and is called a pupil plane (illumination pupil plane) of the illumination optical system. Further, with respect to the illumination pupil plane, an irradiated plane (a surface on which reticle R is placed, or a surface on which wafer W is placed) becomes an optical Fourier transform plane. Incidentally, in the case the number of wavefront splitting by fly-eye lens 5 is relatively large, a high correlation is seen between a wide light intensity distribution formed on the incidence plane of fly-eye lens 5 and a wide light intensity distribution (pupil intensity distribution) of the entire secondary light source. For this reason, the incidence plane of fly-eye lens 5 and the light intensity distribution on a plane optically conjugate to the incidence plane can also be called a light intensity distribution (luminance distribution or light source shape) of the secondary light source (illumination light source).

Referring back to FIG. 1, optical beam LB emitted from fly-eye lens 5 is condensed by condenser optical system 6, and is emitted from illumination system 102, furthermore via illumination fieldstop 7, image-forming optical system 8, bending mirror 9, and the like (hereinafter, parts from condenser optical system 6 to bending mirror 9 will be referred to together as a light-transmitting optical system 10). Optical beam LB which has been emitted, as shown in FIG. 1, is irradiated on reticle R as an illumination light IL. Illumination fieldstop 7 shapes light beam LB (illumination light IL) herein, which illuminates a part (illumination area) of a pattern surface of reticle R.

Reticle stage RST is placed below (−Z side) illumination system 102. On reticle stage RST, reticle R is fixed, for example, by vacuum chucking. Reticle stage RST, for example, is finely drivable within a horizontal plane (XY plane) by a reticle stage drive system (not shown) including a linear motor and the like, and is also drivable in a scanning direction (Y-axis direction) in a predetermined stroke range.

Positional information (including rotational information in the θz direction) of reticle stage RST within the XY plane is constantly detected using a reticle laser interferometer (hereinafter, referred to as "reticle interferometer") 14, via movable mirror 12 (or a reflecting surface formed on an edge surface of reticle stage RST), for example, at a resolution of around 0.25 nm. Measurement information of reticle interferometer 14 is supplied to a main controller 20.

Projection optical system PL is placed below (−Z side) reticle stage RST. As projection optical system PL, for example, a refractive optical system is used, consisting of a plurality of optical elements (lens elements) arrayed along optical axis AX. Projection optical system PL, for example, is double telecentric, and has a predetermined projection magnification (e.g., ¼, ⅕ or ⅛ and the like). Therefore, as previously described, when reticle R is illuminated by illumination light IL from illumination system 10P, via projection optical system PL, a reduced image (a reduced image of a part of the pattern) of a pattern within an illumination area on a pattern surface (a first surface of the projection optical system, object surface) on reticle R, is projected on an exposure area IA on wafer W (a second surface of the projection optical system, image plane) on which a resist (sensitive agent) is coated.

Among a plurality of lens elements that make up projection optical system PL, a plurality of lens elements (not shown) on the object surface side (reticle R side) form a movable lens which is drivable, for example, in the Z-axis direction which is the optical axis direction of projection optical system PL, and in a tilt direction (namely, the θx and θy directions) with respect to the XY plane, by an image-forming performance correction controller 48 which operates under the control of main controller 20. Further, in the vicinity of a pupil plane of projection optical system PL, aperture stop 41 is provided which continuously varies the numerical aperture (NA) within a predetermined range. As aperture stop 41, for example, a so-called iris stop is used. Aperture stop 41 is controlled by main controller 20, via image-forming performance correction controller 48.

Wafer stage WST is driven by a stage drive system 24, which includes a linear motor and the like, on a stage base 22 in the X-axis direction and the Y-axis direction in predetermined strokes, and is also finely driven in the Z-axis direction, θx direction, θy direction, and the θz direction. On wafer stage WST, wafer W is held, via a wafer holder (not shown) by vacuum chucking and the like.

Positional information (rotational information (including yawing amount (rotation amount in the θz direction), pitching amount (rotation amount in the θx direction) and rolling amount (rotation amount in the θy direction))) of wafer stage WST in the XY plane, is constantly detected by a laser interferometer system (hereinafter, referred to shortly as an "interferometer system") 18, via movable mirror 16 (or a reflecting surface formed on an edge surface of wafer stage WST), for example, at a resolution of around 0.25 nm. Measurement information of interferometer system 18 is supplied to main controller 20.

Further, the position of the surface in the Z-axis direction and the tilt of wafer W is measured by a focal point position detection system which has an irradiation system 60a that irradiates an imaging beam to form a large number of images of a pinhole or a slit toward the image-forming plane of projection optical system PL from an oblique direction with respect to optical axis AX, and a photodetection system 60b that receives the reflecting beam of the imaging beam at the wafer W surface. As focal point position detection system (60a, 60b), a system that has a structure similar to the multiple focal point position detection system employing an oblique incidence method whose details are disclosed in, for example, U.S. Pat. No. 5,448,332 and the like, is used.

Further, on wafer stage WST, a fiducial plate FP whose surface is the same height as the surface of wafer W is fixed. On the surface of fiducial plate FP, reference marks which are used for baseline measurement and the like of alignment system AS, a pair of reference marks which are detected by a reticle alignment system to be described later on and the like, are formed.

Further, in wafer stage WST, a luminance distribution measuring instrument 80 is provided which measures pupil luminance distribution on the stage. As shown simplified in FIG. 3, luminance distribution measuring instrument 80 is structured with a cover glass 80a, a condenser lens 80b, a photodetecting section 80c, and the like.

The upper surface of cover glass 80a is equally set to the image-forming surface position of projection optical system PL, namely, the surface position of wafer W mounted on wafer stage WST. On the upper surface of cover glass 80a, a light shielding film that has a circular aperture (pinhole) in the center is formed by vapor deposition of metal such as chrome and the like. This light shielding film keeps unwanted light in the environment from entering photodetecting section 80c when performing measurement of pupil luminance distribution. The receiving surface of photodetecting section 80c is placed at a position optically conjugate with the position of aperture stop 41 (namely, the pupil plane of projection optical system PL and the pupil plane of illumination system IOP) of projection optical system PL via condenser lens 80b, or a position slightly deviated from the position. Photodetecting section 80c has a photodetection element consisting of a two-dimensional COD and the like, and an electric circuit and the like such as, for example, a charge transfer control circuit and the like. Incidentally, measurement data from photodetecting section 80o is sent to main controller 20.

In luminance distribution measuring instrument 80 having the structure described above, a part of illumination light IL emitted from projection optical system PL passes through the pinhole in cover glass 80a, is condensed by condenser lens 80b, and is incident on the receiving surface of photodetecting section 80c. That is, it can be viewed that the receiving surface of photodetecting section 80c is placed at a position conjugate with the pupil plane of projection optical system PL and the pupil plane of illumination system IOP, and the receiving surface receives a beam corresponding to the pupil image at the pupil plane. At the receiving surface of photodetecting section 80c herein, the intensity distribution of illumination light IL at aperture stop 41 of projection optical system PL is reproduced. That is, photodetecting section 80c measures the intensity distribution on aperture stop 41 of a part of illumination light IL that passes through the pinhole of cover glass 80a. Herein, because the position of aperture stop 41 is optically conjugate with the position of the pupil plane of projection optical system PL and the position of the pupil plane of illumination system IOP, measuring the intensity distribution of illumination light IL is equivalent to measuring the pupil luminance distribution.

Incidentally, on the upper surface of cover glass 80a, a position alignment mark (not shown) is provided whose positional relation with the pinhole is known. The position alignment mark is used to calibrate a position of the pinhole on a stage coordinate system, namely a position of luminance distribution measuring instrument 80.

By performing the measurement described above moving wafer stage WST (namely, luminance distribution measuring instrument 80) in the XY two-dimensional direction, pupil luminance distribution is measured for a plurality of points on the irradiated plane (a second surface). Measurement of pupil luminance distribution will be described further later on.

Referring back to FIG. 1, on the side surface of a barrel 40 of projection unit PU, an alignment system AS is provided which detects the alignment marks and reference marks formed on wafer W. As alignment system AS, an FIA (Field Image Alignment) system is used, which is a kind of image-forming type alignment sensor using an image processing method where a broadband (wideband) light such as, for example, a halogen lamp and the like illuminates and detects a mark, and the position of the mark is measured by processing an image (picture image) of the detected mark.

In exposure apparatus 100, although it is not shown, above reticle stage RST, a pair of reticle alignment systems is provided, consisting of a TTR (Through The Reticle) alignment system that uses light of the exposure wavelength whose details are disclosed in, for example, U.S. Pat. No. 5,646,413, and the like. Detection signals of reticle alignment system are supplied to main controller 20.

The control system, in FIG. 1, is mainly structured by main controller 20. Main controller 20 is structured by a so-called workstation (or microcomputer) and the like made up of a CPU (Central Processing Unit), ROM (Read Only Memory), RAM (Random Access Memory) and the like, and has overall control over the entire apparatus. Further, to main controller 20, for example, a storage device 42 consisting of hard disks, an input device 45 which includes a keyboard, a pointing device such as a mouse and the like, a display device 44 such as a CRT display (or a liquid crystal display) and the like, and a drive device 46 which is an information recording medium such as a CD (compact disc), DVD (digital versatile disc), MO (magneto-optical disc) or a FD (flexible disc) and the like, is connected externally. Furthermore, main controller 20 is connected to a LAN 918.

In storage device 42, information and the like is saved, regarding the light source shape (pupil luminance distribution) which makes the image-forming state of the projection image projected on wafer W by projection optical system PL optimal (for example, aberration or line width is within an acceptable range), information on the corresponding illumination system IOP, especially control information of mirror elements SE of spatial light modulator 3S, and information on aberration of projection optical system PL.

In drive device 46, as it will be described later on, an information recording medium (hereinafter described as a CD-ROM for the sake of convenience) is set which contains an SMO (Source and Mask Optimization) program for optimally designing the light source shape and the reticle pattern, a light source condition optimization program for further optimizing the solution (SMO solution) of the SMO of the light source shape, a conversion program for converting the measurement results of luminance distribution measuring instrument 80 into Zernike coefficients which will be described later on and the like. Incidentally, these programs can be installed in storage device 42. Main controller 20 appropriately loads these programs into memory.

Figure 4:
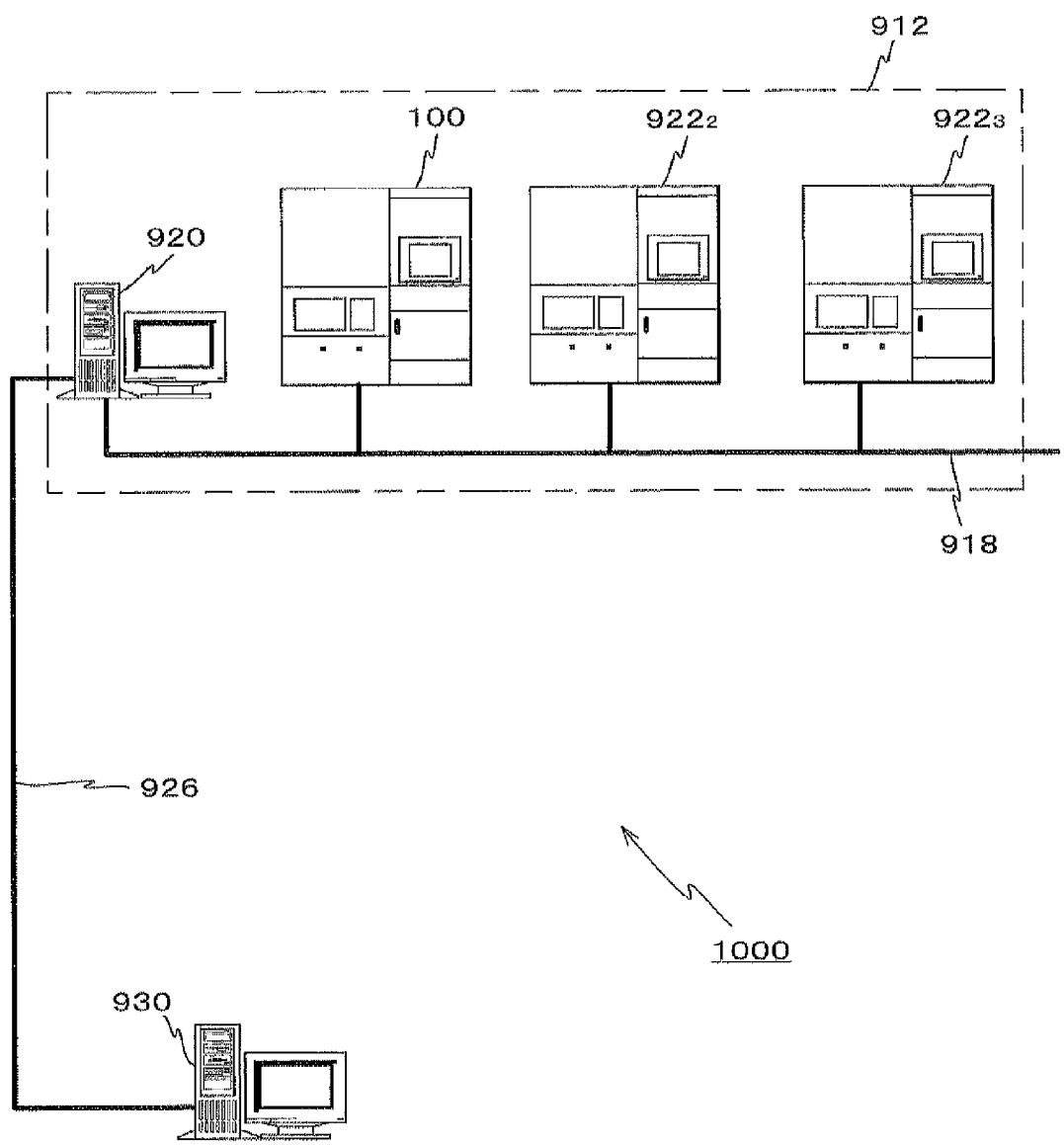
FIG. 4 is a view showing a structure of a company LAN system which contains a lithography system including the exposure apparatus in FIG. 1 in a part of its system.

Further, main controller 20, as shown in FIG. 4, is connected via LAN 918, to the other exposure apparatuses 922$_2$ and 922$_3$ of lithography system 912 which includes exposure apparatus 100 installed inside a clean room, and to a host computer 920 which has overall control over lithography system 912. Host computer 920 is connected to a server 930 which is outside of the clean room, via a Local Area Network (LAN) 926. Lithography system 912 and server 930 each structure a part of a company LAN system 1000 built in a semiconductor factory.

In exposure apparatus 100, similar to an ordinary scanner, after preparatory operations such as wafer exchange, reticle exchange, reticle alignment, baseline measurement of alignment system AS, wafer alignment (EGA and the like) and the like have been performed, an exposure operation by the step-and-scan method is performed. Details thereabout will be omitted.

Next, a control principle of spatial light modulating unit 3 (spatial light modulator 3S) of exposure apparatus 100 will be discussed.

In exposure apparatus 100, based on design data or data on modulation amount (hereinafter described as modulation data) of the light source shape (pupil luminance distribution), spatial light modulator 3S (tilt of mirror element SE) is controlled by its control section (in this case, main controller 20), which reproduces the intensity distribution (pupil luminance distribution) of the illumination light on the illumination pupil plane, namely the light source shape.

The light source shape (pupil luminance distribution) actually formed by spatial light modulator 3S is expressed using a function of a coordinate within the pupil plane, e.g., an orthogonal coordinate $\xi,\eta$, using $\Psi(\xi,\eta)$. This pupil luminance distribution is considered in general to be a different distribution from a distribution pupil luminance distribution $\Psi_{DESIGN}(\xi,\eta)$ which was initially wanted that spatial light modulator 3S should have originally formed. As for the reasons, for example, various kinds of control errors of spatial light modulator 3S itself, transmittance distribution of the lens, and aberration that the optical system has and the like can be considered. Accordingly, as a means of feeding back to spatial light modulator 3S so that $\Psi(\xi,\eta)$ actually obtained becomes even a little closer to $\Psi_{DESIGN}(\xi,\eta)$ or precisely grasping whether or not the residual amount which still remains after performing multiple feedbacks is acceptable or not, a concept of modeling a casual relationship between $\Psi_{DESIGN}(\xi,\eta)$ and $\Psi(\xi,\eta)$ in some kind of a formula expression which includes a plurality of parameters becomes effective.

The causal relationship described above is, in general, $$\Psi(\xi,\eta) \cong Q[\Psi_{DESIGN}(\xi,\eta),Z_1,Z_2,\ldots,Z_i] \quad (1)$$

where it can be approximately expressed, using a modulation operation Q to which some kind of a realistic model is reflected and a plurality of modulation factors $Z_1, Z_2 \ldots Z_i$. As an example of a model for this modulation operation and modulation factor, transmittance modulation effect and distortion modulation effect, which are representatives of distribution modulating action by the optical system, will be described herein. First of all, in the case of the former transmittance modulation, the following expressions can be considered.

$$\Psi(\xi,\eta) = T(\xi,\eta)\Psi_{DESIGN}(\xi,\eta) \quad (2a)$$

$$T(\xi,\eta) \equiv \exp\left[\sum_i Z_i f_i(\xi,\eta)\right] \quad (2b)$$

Herein, $T(\xi,\eta)$ denotes the net transmittance distribution function, and $f_i(\xi,\eta)$ denotes the Fringe Zernike polynomials. Expansion coefficient $Z_i$ of each order is equivalent to 0 when there is no transmittance modulation, and in such a case, transmittance is exactly 1.

In transmittance distribution function $T(\xi,\eta)$ of an index function type defined by formula (2b), because the linear sum of the Fringe Zernike polynomials is an exponent, transmittance distribution function $T(\xi,\eta)$ can be expressed as a product $T(\xi,\eta)=\Pi_i T_i(\xi,\eta)$ of the $i^{th}$ order transmittance distribution function $T_i(\xi,\eta) \equiv \exp[Z_i f_i(\xi,\eta)]$ which is expressed using the $i^{th}$ order Fringe Zernike polynomial $f_i(\xi,\eta)$, that is, the total transmittance modulation can be expressed as a synthesis of transmittance modulations expressed of different plurality of $i^{th}$ order transmittance distribution functions $T_i(\xi,\eta)$. Incidentally, when expansion coefficient $Z_1$ is 0, transmittance distribution function is $T_i(\xi,\eta)=1$. Accordingly, transmittance distribution function $T(\xi,\eta)$ is suitable to express transmittance modulation.

Further, in the case of distortion modulation, in general, the following expression can be used on the pupil coordinate value before and after the modulation.

$$\begin{cases} \xi' \equiv \xi + g_x(\xi, \eta) \\ \eta' \equiv \eta + g_y(\xi, \eta) \end{cases} \quad (3)$$

Figure 12:
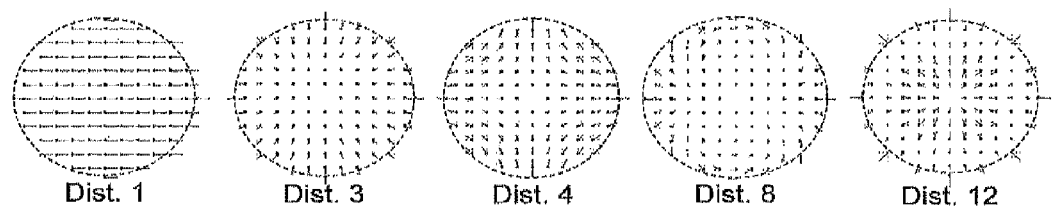
FIG. 12 is a view used to explain a distortion modulation using the second model in FIG. 11.

This formula denotes, for example, as shown in FIG. 12, an operation where each position ($\xi,\eta$) (equivalent to each pixel in numerical calculation) within the pupil plane before modulation finely moves to a position ($\xi',\eta'$) decided by a function $g_x, g_y$, and by this operation, a modulating action of the pupil luminance distribution consequently occurs, based on distortion (distortion of distribution), which is represented, for example, by a pincushion type or a barrel type distortion. Incidentally, such a distortion modulating action can also be concretely defined by applying the Zernike polynomials expression described earlier. FIG. 11 denotes such definition, and for example, in the case modulation occurs only in the $4^{th}$ order distortion polynomial (Dist-4), it is realized as formula (4) below.

$$\begin{cases} g_x(\xi, \eta) = Z'_4 \times \{f_2(\xi, \eta)\} \\ g_y(\xi, \eta) = Z'_4 \times \{-f_3(\xi, \eta)\} \end{cases} \quad (4)$$

Herein, $Z'_4$ is equivalent to the $4^{th}$ order expansion coefficient of a distortion polynomial, and the amount of the numerical value determines the degree of this $4^{th}$ order distortion. That is, DX and DY in FIG. 11 are unit vectors that indicate which of the parameters of pupil plane coordinates $\xi$ and $\eta$ are subject to modulation. Accordingly, a more general modulating action using this distortion polynomial can be expressed as in the following formula (5), as a mixed effect of a distortion modulation of a plurality of orders.

$$\begin{cases} \xi' = \sum_i Z'_i \{D_i(\xi, \eta) \cdot D\xi\} \\ \eta' = \sum_i Z'_i \{D_i(\xi, \eta) \cdot D\eta\} \end{cases} \quad (5)$$

Herein, $D_i$ is a distortion polynomial (vector expression) of each order defined in FIG. 11, and $D\xi, D\eta$ are unit vectors for pupil plane coordinates $\xi, \eta$. In distortion polynomials defined in such a manner, because the modulating action of each order is equivalent to a mutually orthogonal operation, this has a merit which benefits in variation table control and in index expression and the like.

By modeling the modulation relation between $\Psi_{DESIGN}$ ($\xi,\eta$) and $\Psi(\xi,\eta)$ in some kind of a concrete manner, for example, as it will be described in detail later on, by making a database of information on the variation amount of the image-forming performance corresponding to the variation amount of each coefficient of each modulated parameter $Z_i$ in advance, that is, for each modulated parameter $Z_i$, a database can be made of information on image-forming performance variation in the case of an illumination luminance distribution when the coefficient of each modulated parameter is minutely varied individually and image modulation is performed.

This makes it possible to perform a cumulative fine modulation of illumination luminance distribution defined from the values of each modulated parameter $Z_i$ on spatial light modulator 3S (OPE matching), with the purpose of effectively nearing the image-forming performance that illumination luminance distribution $\Psi$ ($\xi,\eta$) has actually obtained to the image-forming performance by illumination luminance distribution $\Psi_{DESIGN}(\xi,\eta)$ which should be originally obtained.

Further, as other use of modeling related to such modulating action, for example, by calculating a parameter group $Z_i$ based on formula (1) that matches the relation between an image before and after the modulation using the least-squares method and the like, even in the case of a complicated pupil luminance distribution which cannot be possibly expressed by several geometrical parameters such as the conventional simple annular illumination or multipole illumination, $Z_i$ can be used as a representative index value which decides the feature of the luminance distribution, and a use of using $Z_i$ as a specified value can also be considered.

Incidentally, besides the two types of models described above, for example, models can be added as necessary also for components such as a blurring effect that occurs induced by an optical system or flare light, which allow a more realistic modulating action related to illumination luminance distribution to be expressed.

Next, measurement of the light source shape (pupil luminance distribution) of exposure apparatus 100 will be described. Measurement of the light source shape (pupil luminance distribution) is performed when making the calculation parameters previously described, and in optimization (OPE matching) and the like of the light source shape (SMO solution) which will be described later on.

Measurement of the light source shape (pupil luminance distribution) is started by instructions from an operator and the like. Main controller 20, after the instructions, calibrates the position of luminance distribution measuring instrument 80 prior to starting the measurement. Herein, main controller 20 drives wafer stage WST via stage drive system 24, and positions luminance distribution measuring instrument 80 mounted on wafer stage WST directly under alignment system AS. After this positioning, main controller 20 uses alignment system AS, and detects the position alignment mark (not shown) provided on luminance distribution measuring instrument 80. Main controller 20 obtains the position of the position alignment mark on the stage coordinate system, that is, obtains the accurate position of luminance distribution measuring instrument 80, using the detection results of the position alignment mark and the measurement results of interferometer system 18 at the time of detection.

When calibration has been completed, main controller 20 uses a reticle loader (not shown) and loads (refer to FIG. 3) a measurement reticle (hereinafter referred to as a pinhole reticle) PR on reticle stage RST. Pinhole reticle PR is a reticle that has a pinhole pattern formed at a plurality of (N) points within the same area as illumination area IAR on its pattern surface. Incidentally, placement of the pinhole patterns is decided so that illumination light IL that passes through the pinhole patterns disperses almost on the entire area of the pupil plane of projection optical system PL, namely so that almost all of illumination light IL emitted from the illumination pupil plane of illumination system IOP pass through either one of the pinhole patterns. This allows the pupil luminance distribution for almost the entire area of the illumination pupil plane of illumination system IOP, namely, the light source shape to be measured.

After loading pinhole reticle PR, main controller 20 performs reticle alignment. Main controller 20, herein, detects a pair reticle alignment marks formed on pinhole reticle PR using the pair of reticle alignment systems previously described, and based on the detection results, finely drives reticle stage RST and positions pinhole reticle PR to a predetermined position. This makes the center of pinhole reticle PR substantially coincide with optical axis AX of projection optical system.

When reticle alignment has been completed, main controller 20 starts the main measurement of light source shape (pupil luminance distribution).

Figure 3:
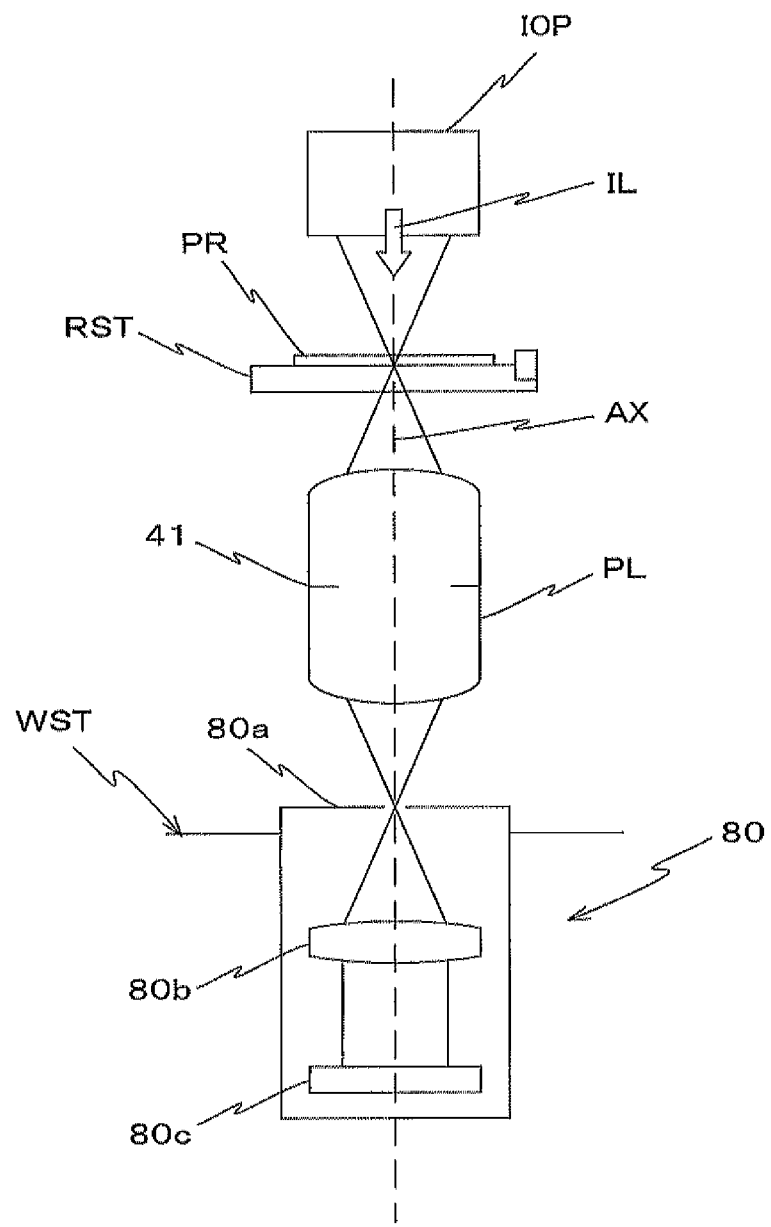
FIG. 3 is a view showing an example of a luminance distribution measuring instrument used to measure a pupil luminance distribution.

Main controller 20, as previously described, reproduces the light source shape (pupil luminance distribution) controlling spatial light modulator 3S (tilt of mirror element SE), based on design data of the light source shape (pupil luminance distribution). This allows illumination light IL having an optimally designed light source shape (pupil luminance distribution) to be emitted from illumination system IOP as shown in FIG. 3, and to be irradiated on pinhole reticle PR. Illumination light IL that passes through the plurality of pinholes of pinhole reticle PR is condensed on the image plane via projection optical system PL, and images of the pinholes are formed.

Main controller 20 drives wafer stage WST via stage drive system 24 while monitoring the measurement values of interferometer system 18, and positions the center of the aperture on cover glass 80a of luminance distribution measuring instrument 80 to a position (image-forming point) where an image of one of the pinholes (in this case, a first pinhole) is formed. Simultaneously, main controller 20 uses focal point position detection system (60a, 60b) and measures the surface position and tilt of cover glass 80a, and by performing focus-leveling control of wafer stage WST via stage drive system 24, positions the upper surface of cover glass 80a to the image-forming point (image plane). This allows the illumination light (detection light) passing through the first pinhole to pass through the aperture on cover glass 80a, and to be received by the photodetection element within photodetecting section 80c via condenser lens 80b.

Figure 5:
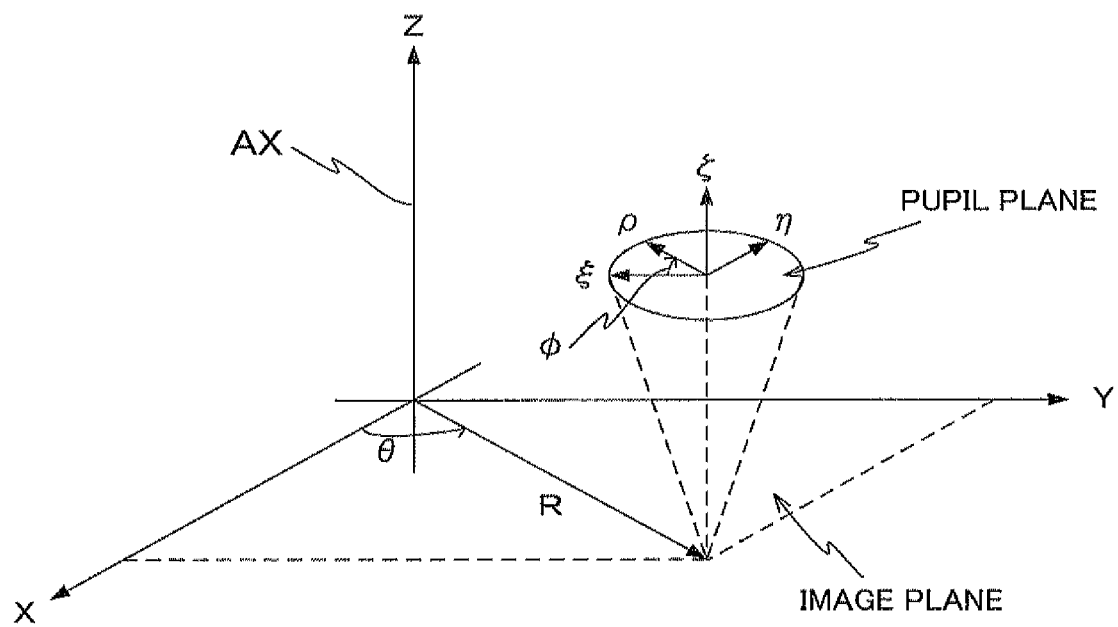
FIG. 5 is a view showing a relation between an image plane (image plane coordinate system) and a pupil plane (pupil plane coordinate system) of a projection optical system.

The photodetection element (two-dimensional CCD and the like) within photodetecting section 80c detects (measures the light intensity distribution) the light intensity inside the cross section of illumination light IL which has passed through the first pinhole and the aperture. This light intensity distribution corresponds to a pupil luminance distribution $\psi_1(\xi,\eta)$ for a part of illumination light IL that has passed through the first pinhole. Herein, FIG. 5 shows a relation between the image plane (image plane coordinate system) and the pupil plane (pupil plane coordinate system) of projection optical system PL.

When the measurement of the pupil luminance distribution using the first pinhole has been completed, main controller 20 performs a similar pupil luminance distribution measurement, using the next pinhole. Main controller 20 drives wafer stage WST, and positions the center of the aperture on cover glass 80a of luminance distribution measuring instrument 80 to an image-forming point where an image of a second pinhole is formed. After the positioning, in a similar manner as before, pupil luminance distribution $\psi(\xi,\eta)$ is measured.

Similarly, main controller 20 measures pupil luminance distribution $\psi_n(\xi,\eta)$ using all the pinholes n (=1~N). This allows pupil luminance distribution $\Psi(\xi,\eta)=\Sigma_{n=1\sim N}\psi_n(\xi,\eta)$ on the entire pupil plane to be obtained.

Main controller 20 forwards the measurement results of light source shape (pupil luminance distribution) $\Psi(\xi,\eta)$ to host computer 920 or server 930. Incidentally, in a precise sense, because the light source shape (pupil luminance distribution) is measured for dispersion points on the pupil plane coordinate system, measurement results $\Psi(\xi,\eta)$ are expressed as dispersion data.

Incidentally, in exposure apparatus 100, because illumination light IL is detect via projection optical system PL, in the measurement results of the pupil luminance distribution, in principle, optical system errors of projection optical system PL are included. However, in the present embodiment, unless it is noted, there should be no optical system errors of projection optical system PL, or the errors are to be corrected.

Next, optimal design of the light source shape (pupil luminance distribution) and a mask pattern by SMO (Source and Mask Optimization) will be briefly described.

In exposure apparatus 100, by using spatial light modulating unit 3 (spatial light modulator 3S), the pattern surface of a mask (reticle) can be illuminated at a desired (arbitrary) illuminance distribution. This allows the resolution, contrast, depth of focus and the like of the projection image to be further improved, overcoming the adjustment limitations of illumination conditions by modified illumination such as the conventional annular illumination, multipole illumination and the like.

As previously described, spatial light modulator 3S has a plurality (J) of mirror elements SE, and by tilting each mirror element SE independently around two mutually orthogonal axes, and partially modulating the opposite direction of optical beam LB within the cross section of the beam, a desired light source shape (pupil luminance distribution) is formed.

Herein, spatial light modulator 3S has a degree of freedom which is a number (2J) equal to at least a product of the number of mirror elements SE and the number of tilt directions. To set the shape (light source shape) of the illumination light source using spatial light modulator 3S that has a degree of freedom of such a large number, and to accurately transfer the pattern formed on the mask onto the wafer (namely, to form the projection image of the pattern on the wafer with a desired image-forming performance), recently, the SMO is utilized in process development to optimally design both the light source shape (pupil luminance distribution) and the mask pattern.

Figure 6:
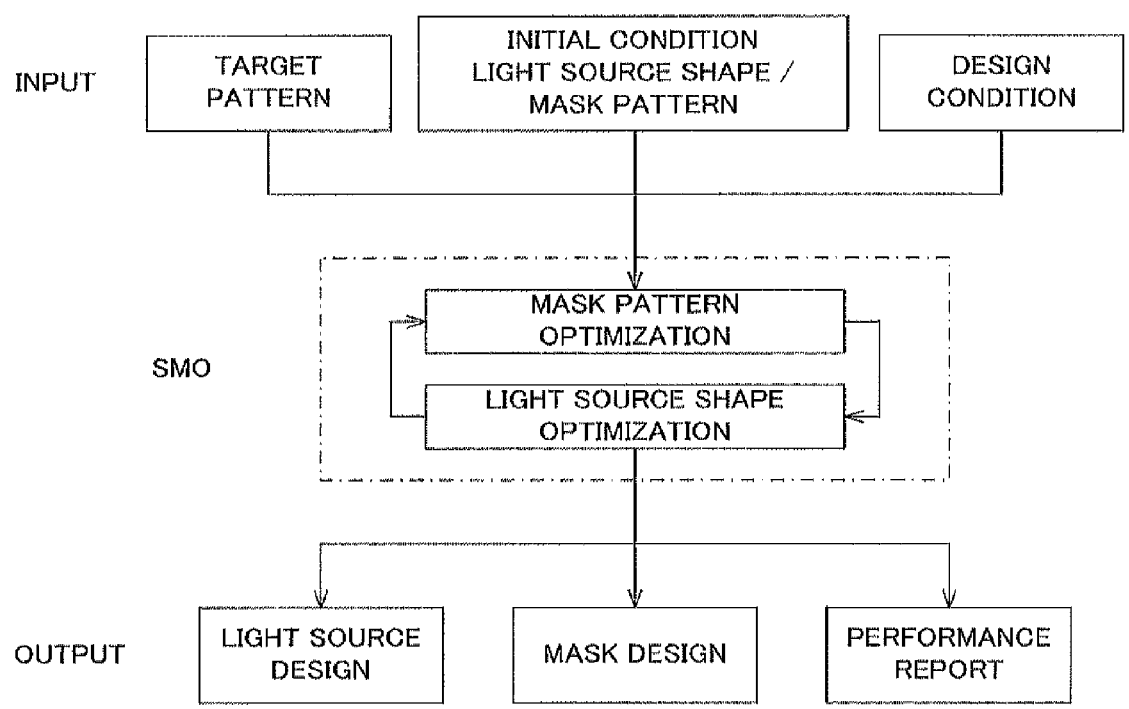
FIG. 6 is a view showing an outline of an optimal design procedure of a light source shape (pupil luminance distribution) and a reticle pattern by an SMO.

FIG. 6 shows an outline of the SMO procedure. On starting the SMO, a target (target pattern) of the pattern to be transferred on the wafer, initial design (initial condition) of the light source shape and the mask pattern, and various conditions (optimization evaluation method, constraint conditions and the like coming from the performance of the exposure apparatus) related to optimal design are to be specified. As an example, with regard to the target pattern shown in FIG. 7A, the light source shape and the mask pattern are optimally designed so that the focus range (depth of focus) in which the contrast of the projection image is within an acceptable range becomes maximum. Incidentally, in the target pattern of FIG. 7A, the bright pattern and the dark pattern are indicated using an outlined circle and a black circle, respectively. Further, the boundary of both patterns is a so-called log slope.

First of all, with regard to the light source shape specified as the initial condition, a mask pattern is obtained that can obtain a projection image of the target pattern at a maximum depth of focus. Incidentally, in the present embodiment, a phase-shift mask is employed that can continuously modulate the transmittance of light from 0 to 1, and the phase of transmitting light from 0 to π. Therefore, as the mask pattern, a transmittance distribution and a phase-shift distribution are designed. The mask pattern specified as the initial condition, for example, is repeatedly optimized, applying a trial and error method which is a type of analytical technique. After the optimization, with respect to the obtained mask pattern, a light source shape is obtained that can obtain a projection image of the target pattern at a maximum depth of focus. The light source shape specified as the initial condition is repeatedly optimized, for example, applying a trial and error method.

Next, with respect to the light source shape and mask pattern obtained by the first cycle of optimization described above, a similar optimization is performed. The similar optimization is further repeated, and for each repetition, depth of focus (maximum depth of focus) in which the contrast of the projection image is within an acceptable range is obtained. When the maximum depth of focus which has been obtained converges in the range of the designated convergence rate, the repetition is completed.

Figure 7A:
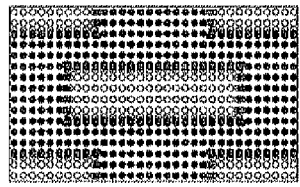
FIG. 7A is a view showing a target pattern input to the SMO.
Figure 7B:
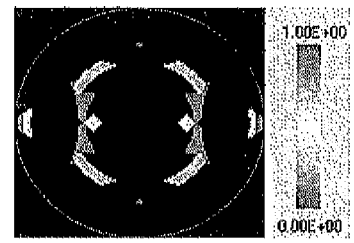
FIG. 7B is a view showing the SMO solution of a light source shape.
Figure 7C:
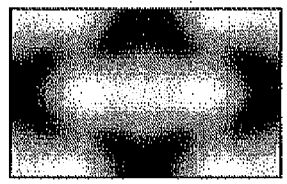
FIG. 7C and FIG. 7D are views showing SMO solutions of a mask pattern (transmittance distribution and phase-shift distribution, respectively)
Figure 7D:
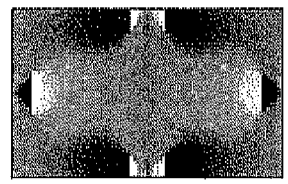
Figure 7E:
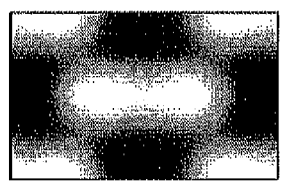
FIG. 7E to FIG. 7G are views showing a performance (focus dependency of projection image) of the SMO solutions.
Figure 7F:
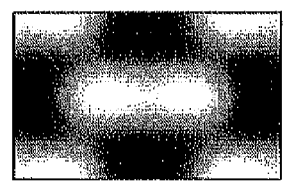
Figure 7G:

Finally, the SMO solution of the light source shape and the mask pattern and the performance of the SMO solution are reported. With respect to the target pattern in FIG. 7A, the light source shape (pupil luminance distribution) shown in FIG. 7B, and the transmittance distribution and phase-shift distribution of the mask pattern shown in FIG. 7C and FIG. 7D, respectively, are obtained. Further, with respect to the light source shape (pupil luminance distribution) and mask pattern which are optimally designed, as shown in FIG. 7E to FIG. 7G, it can be seen that within the range of depth of focus 100 nm, the projection image of the target pattern can be obtained with the contrast in an acceptable range.

Incidentally, in the present embodiment, the SMO described above is to be performed by host computer 920 that has overall control over a device manufacturing system which is made up including exposure apparatus 100 and the like, or by server 930. A mask is manufactured, based on the optimally designed mask pattern. Herein, a plurality of masks is made that are used when manufacturing at least one device. Corresponding to the pattern of the mask that has been made, design data of the light source shape that has been optimally designed is stored (saved) in storage device 42 connected to main controller 20 of exposure apparatus 100. Main controller 20, on exposure processing and the like, reads the design data of the light source shape corresponding to the mask pattern from storage device 42, and based on the design data of the light source shape that have been read, reproduces the light source shape (pupil luminance distribution) controlling spatial light modulator 3S (tilt of mirror element SE) as previously described.

However, as previously described, the light source shape (pupil luminance distribution) reproduced by spatial light modulating unit 3 (spatial light modulator 3S) deviates from the light source shape (SMO solution) optimally designed by the SMO due to various kinds of errors. By this deviation, image-forming performance, especially the OPE results differently from the target value (OPE error occurs).

Figure 8A:
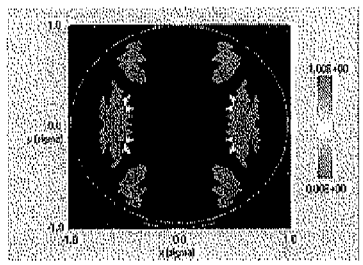
FIG. 8A is a view showing the SMO solution of a light source shape (pupil luminance distribution)

FIG. 8A shows the SMO solution of the light source shape (pupil luminance distribution). Further, in FIG. 8B, with respect to the SMO solution, a line width (result of an image-forming simulation) is shown of an image of a test pattern projected on the wafer in exposure apparatus 100. As the test pattern, herein, a line and space pattern is used, including a plurality of (eight) line patterns having a line width of 45 nm and a pitch of 110-500 nm. As is obvious from FIG. 8B, while the line width is slightly deviated from the design (45 nm), the degree of deviation is small and the degree of dependence to the pitch and defocus is also not so large.

Figure 8B:
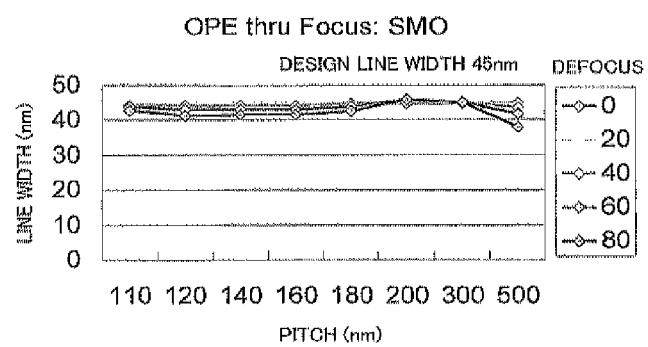
FIG. 8B is a view showing detection results of line width of a test pattern transferred onto a wafer with respect to the SMO solution of a light source shape (pupil luminance distribution)
Figure 8C:
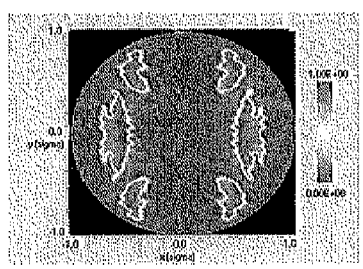
FIG. 8C is a view showing a light source shape (pupil luminance distribution) reproduced by a spatial light modulating unit (spatial light modulator) based on the SMO solution.

FIG. 8C shows a light source shape (pupil luminance distribution) which has been reproduced based on the SMO solution in FIG. 8A, using a spatial light modulating unit similar to spatial light modulating unit 3 (spatial light modulator 3S). Incidentally, the light source shape (pupil luminance distribution) is measured using a measuring instrument similar to luminance distribution measuring instrument 80 as previously described. As is obvious when comparing with the SMO solution, while the contour is almost accurately reproduced, fine shapes are not reproduced which makes the contour smooth, and also makes the edge slope gentle.

Figure 8D:
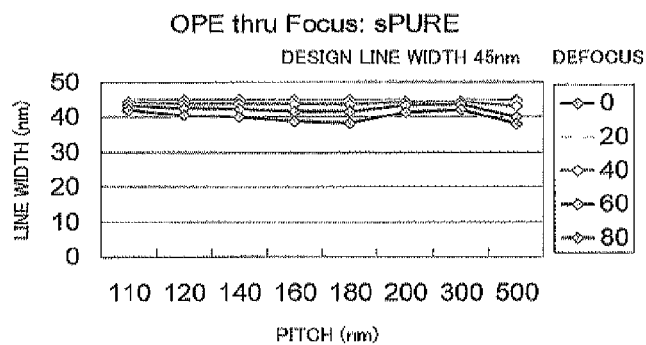
FIG. 8D is a view showing detection results of line width of a test pattern transferred onto a wafer with respect to the reproduced light source shape (pupil luminance distribution)

Further, in FIG. 8D, with respect to the light source shape (pupil luminance distribution) which has been reproduced, detection results of a line width of a test pattern transferred onto a wafer using an exposure apparatus similar to exposure apparatus 100. As is obvious when compared to FIG. 8B, detection results of the line width deviates greatly from the design (45 nm), and also varies with respect to the pitch. Furthermore, the degree of variation becomes noticeable when defocus becomes large.

As it can be seen from the description above, when manufacturing devices with a device rule of 32 nm or under in the future, the light source shape (SMO solution) designed by the SMO will have to be optimized further, especially taking the OPE errors into consideration.

Conventionally, as a means of the OPE matching, fine adjustment has been performed on illumination luminance distribution. In such a case, in the case of a simple circular illumination, fine adjustment to vary the radius has been performed using a movable mechanism within the illumination system, and in the case of annular illumination, fine adjustment was performed on the outer diameter and the inside diameter. Meanwhile, in these days, cases that require an extremely complicated illumination luminance distribution frequently occur as is previously described, and to realize such an illumination luminance distribution, the presence of spatial light modulator 3S is positioned as a concrete means. And in order to consequently achieve the desired image-forming performance by performing some kind of a fine adjustment to the complicated illumination luminance distribution, as is previously described, it is considered desirable to manage and control some parameters (equivalent to $Z_1$, $Z_2$ . . . $Z_i$ of formula (1)) related to modulation contents between the illumination luminance distribution initially wanted and the illumination luminance distribution which was actually formed. This is because since such modulated parameters are physical amounts which are not dependent at all on the original illumination luminance distribution, the feature of the illumination luminance distribution actually measured by a parameter of the same content can be expressed, however complicated the distribution may be.

And from here onward, without being bounded to the purpose of performing the OPE matching, the purpose of the description will focus on a method of pursuing the initially wanted performance for at least one physical index among the arbitrary physical indexes related to a consequent image-forming performance such as, for example, process window information. In other words, the OPE matching on a representative image-forming performance index called the OPE is included as one of its purposes.

A physical amount indicating a consequential image-forming performance is expressed as U herein. Under the premise that the mask information actually used is constantly the same, this physical amount U can be tied by the following relation.

$$U = P[\Psi(\xi,\eta)] \quad (6)$$

Herein, P indicates a calculation operation to calculate U, which is an image-forming performance evaluation physical amount represented by the OPE, when a concrete illumination luminance distribution is given. Namely, for example, this calculation is equivalent to a wave optical image-forming calculation of the projection optical system. On the calculation, the evaluation index value which is obtained in the case of initially wanted illumination luminance distribution $\Psi_{DESIGN}(\xi,\eta)$ is defined as follows.

$$U_0 = P[\Psi_{DESIGN}(\xi,\eta)] \quad (7)$$

Herein, because the physical amount that really should be focused on is the relative variation from an ideal state related to the image-forming performance in the case of the illumination luminance distribution actually obtained, when the relative variation is $\Delta$, then it can be defined as follows.

$$\Delta \equiv U - U_0 \quad (8)$$

Herein, when taking formula (1) into consideration, it can be understood that this $\Delta$ is a function which is dependent on the following physical amount.

$$\Delta \rightarrow \Delta(\Psi_{DESIGN}(\xi,\eta), Z_1, Z_2, \ldots, Z_i) \quad (9)$$

That is, this can be explained by a casual relationship in which a predetermined image-forming performance is dependent on a plurality of parameters $Z_1, Z_2 \ldots Z_i$ that determine minute variation from an initially wanted illumination luminance distribution, and therefore deviates from an initially wanted state. However, the relation between the parameter described above and $\Delta$ is generally a complicated nonlinear relation. However, if the premise is at a stage where a rough feedback is already completed by spatial light modulator 3S, and the initially wanted image-forming performance can be obtained by a fine modulation taking into consideration image-forming performance viewpoints, it is effective that the variation of $\Delta$ from 0 in the case parameter $Z_i$ has a finite value of a minutely small amount should be treated as an approximate, as a linear variation.

In the purpose described above, the necessary preparation to perform in advance, is to prepare a variation table information related to a series of variation of $\Delta$ which occurs according to the individual fine modulation of the plurality of parameters $Z_1, Z_2 \ldots Z_i$ that decides the minute variation from the initially wanted illumination luminance distribution. In other words, each of $Z_1, Z_2 \ldots Z_i$ described below requires variation of $\Delta$, namely tilt (partial differentiation) information, in the vicinity of 0.

$$\frac{\partial \Delta}{\partial Z_1}, \frac{\partial \Delta}{\partial Z_2}, \ldots, \frac{\partial \Delta}{\partial Z_i} \quad (10)$$

This information can be calculated, in concrete, by performing image-forming calculation on the illumination luminance distribution which has been finely modulated using minute amount $Z_i$, calculating variation $\Delta$ from an ideal value related to the image-forming physical index obtained from the image-forming calculation, and dividing the value by $Z_i$ originally used to modulate the value. And the same operation is to be performed, performing the calculation on all of the series of modulated parameters.

From here onward, a fine modulation feedback method for illumination luminance distribution represented by the OPE matching will be described, using the variation table information shown above. First of all, for the actual illumination luminance distribution $\Psi(\xi,\eta)$ which requires such feedback, the image-forming performance is calculated, based on formula (6). And, a divergence amount $\Delta$ with respect to an image-forming performance index value from an ideal luminance distribution obtained by the calculation is $\Delta_{REAL}$. Next, a least squares fitting is performed so that this $\Delta_{REAL}$ can be restored by linear combination based on the variation table information of formula (10).

$$\Delta_{REAL} = c_1 \frac{\partial \Delta}{\partial Z_1} + c_2 \frac{\partial \Delta}{\partial Z_2} + \ldots + c_i \frac{\partial \Delta}{\partial Z_i} \quad (11)$$

Figure 13:
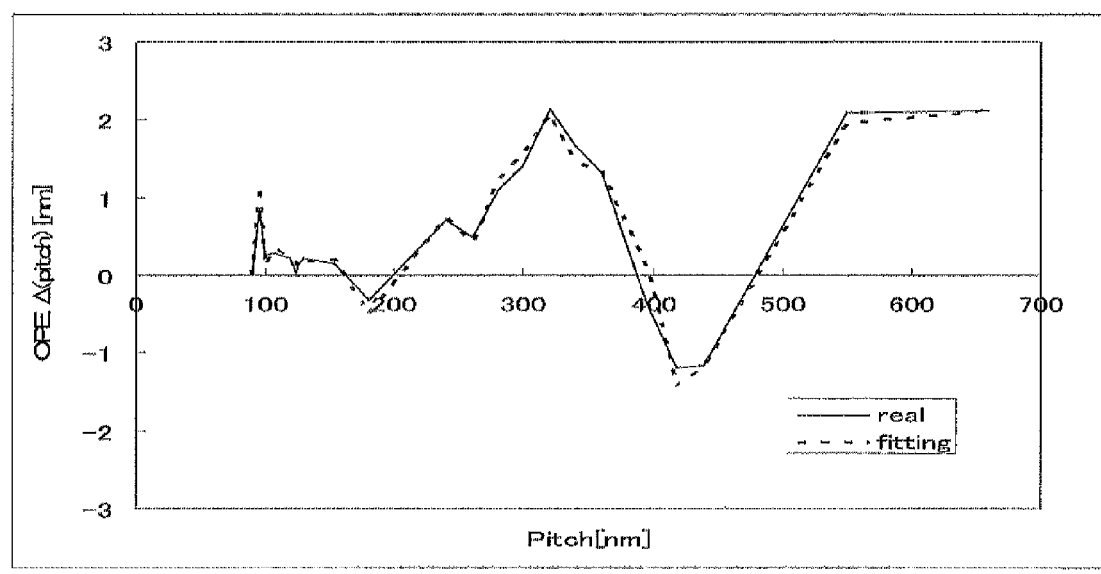
FIG. 13 is a view showing a result of the OPE matching.

Herein, $c_1, c_2, \ldots, c_i$ indicate coefficients when the fitting is consequently performed. FIG. 13 shows an example of the fitting based on formula (11). Incidentally, in the case of the OPE evaluation, because $\Delta$ described above is a function for the pitch of the pattern, the operation which is actually performed is a fitting on such function distribution. In the example in FIG. 13, based on the variation table information of parameters that vary several illumination luminance distributions, a fitting is performed to see what kind of a modulation should be performed combined at what weight to obtain the same effect to match the OPE curve of the solid line $\Delta_{REAL}$. And from coefficients $c_1, c_2, \ldots, c_i$ obtained by this fitting, to illumination luminance distribution $\Psi(\xi,\eta)$ obtained at the present stage, a reverse modulation, namely, an additional modulation described below is performed when using the expression of formula (1).

$$\Psi_{OPTIMIZED}(\xi,\eta) = Q[\Psi(\xi,\eta), -c_1, -c_2, \ldots, -c_i] \quad (12)$$

By this modulation, image-forming performance index value U by illumination luminance distribution $\Psi_{OPTIMIZED}(\xi,\eta)$ to which a predetermined additional modulation has been performed, can be a value approaching an evaluation index value $U_0$ which is obtained in the case of the initially wanted illumination luminance distribution $\Psi_{DESIGN}(\xi,\eta)$. Further, even if feedback is performed in an area where linearity is not realized, by performing the fitting operation described above sequentially for a few times, a desired optimization becomes possible.

Figure 9:
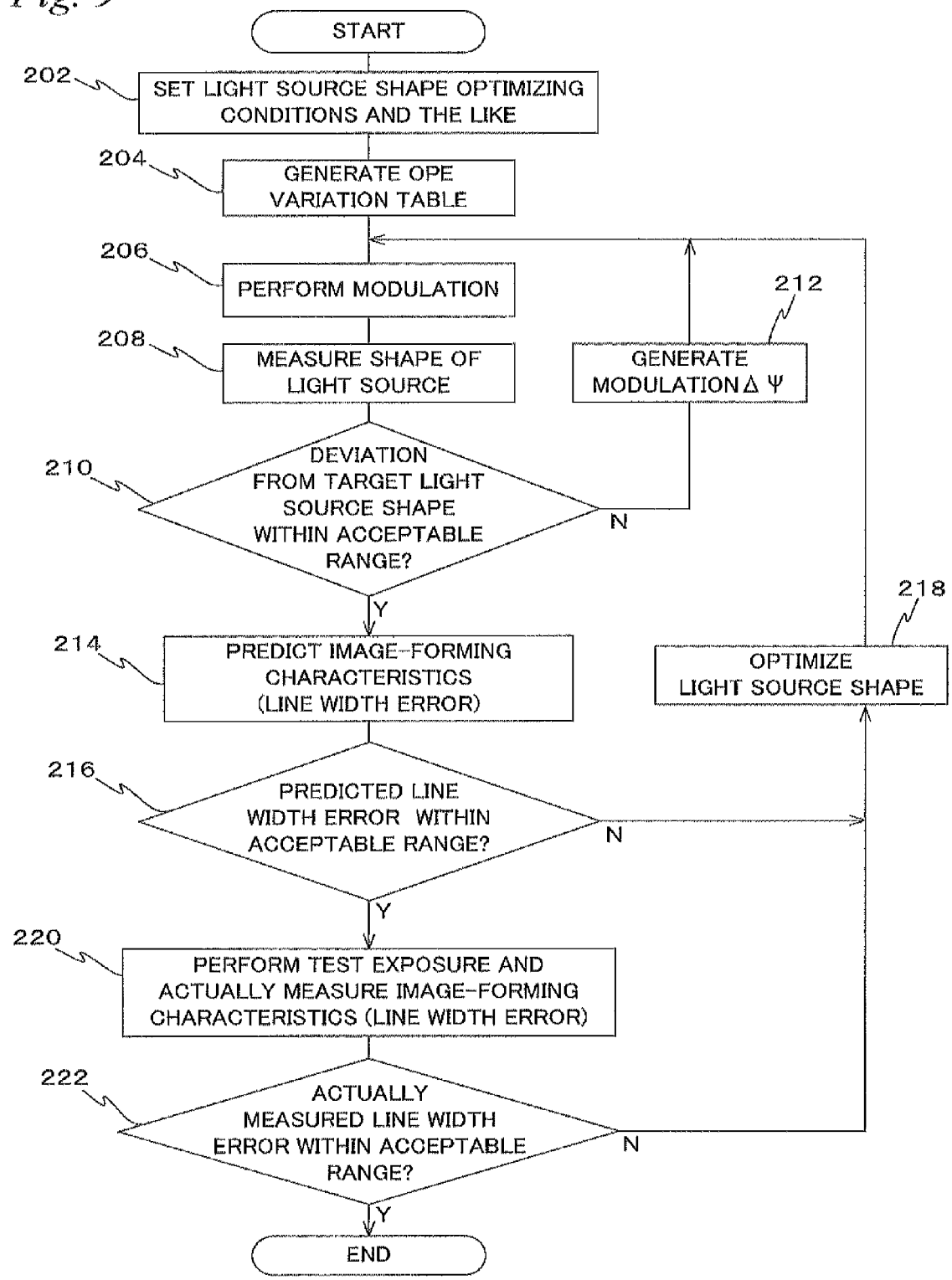
FIG. 9 is a flow chart showing an outline procedure of an OPE matching of the SMO solution of light source shape (pupil luminance distribution)

FIG. 9 shows a flow chart showing an outline procedure of the OPE matching of the SMO solution. The OPE matching of the SMO solution starts by the operator and the like giving instructions, via input device 45.

Incidentally, prior to the OPE matching of the SMO solution, the light source shape and the mask pattern are optimally designed by the SMO as previously described, and such design data is to be stored (saved) in storage device 42.

In the first step 202, optimizing conditions of the light source shape such as, for example, the SMO solution for the light source shape (illumination luminance distribution) and the mask pattern previously described, a model expressing the light source shape (modulation operation Q in formula (1)), a test pattern (type, projection position and the like) to evaluate the OPE (OPE error), an index (physical amount) to evaluate the OPE error and its acceptable limitation, an index to evaluate the light source shape, its acceptable limitation, and light source shape (reference shape) $⟨⟨\Psi⟩⟩$ and the like serving as a reference, are set. Herein, main controller 20 reads the SMO solution of the light source shape and mask pattern from storage device 42. Other conditions are set by the operator and the like, via input device 45. As an example, a plurality of (K) types of line and space patterns (k=1-K) having the same line width 45 nm and a pitch which is mutually different in a range of 110-500 nm are set as test patterns, errors (line width errors) of the image-forming line width are set serving as an evaluation index of the OPE error, and RMS (Root Mean Square) errors of the reference shape are set serving as an evaluation index of the light source shape and the like.

Further, as a model expressing modulation operation Q in formula (1), the Zernike polynomials shown in FIG. 10, or the distortion functions shown in FIG. 11 is set. Further, as reference shape $\langle\!\langle \Psi \rangle\!\rangle$, SMO solution $\Psi_{DESIGN}(\xi,\eta)$ is selected.

Further, main controller 20 controls spatial light modulator 3S, based on SMO solution $\Psi_{DESIGN}(\xi,\eta)$ of the light source shape. By this control, light source shape $\Psi(\xi,\eta)$ is obtained. However, due to the OPE error previously described, the obtained light source shape $\Psi(\xi,\eta)$ deviates from $\Psi_{DESIGN}(\xi,\eta)$. Incidentally, through the OPE matching, projection optical system PL (and light-transmitting optical system 10) are to be in a reference state. Furthermore, unless it is noted, there are to be no optical system errors such as aberration and the like of projection optical system PL, or the optical system errors are to be corrected.

In the next step 204, an OPE variation table is made which is a type of image-forming performance variation table. Herein, the OPE variation table is partial differentiation information defined by formula (10). Main controller 20, in step 202, calculates partial differentiation information for line width error $\Delta_{CD,k}$ of the $k^{th}$ type test pattern(=1-K) set as an index to evaluate the OPE error $\Delta$. Numeric data of the obtained partial differentiation information, is held in a table form in memory (not shown).

In the next step 206, spatial light modulator 3S is controlled based on modulation operation Q (modulated parameters $Z_1$-$Z_i$), and the light source shape is set. In this case, because modulated parameters $Z_1$-$Z_i$ are not given ($Z_1$-$Z_i$=0), modulation is not performed. Accordingly, light source shape initially set in step 202 is maintained.

In the next step 208, light source shape W reproduced on exposure apparatus 100 in step 206 is measured, using luminance distribution measuring instrument 80. Details of the measurement method are as previously described. Measurement results of light source shape W are described as $\langle \Psi \rangle$.

In the next step 210, measurement results $\langle \Psi \rangle$ of the light source shape obtained in step 208 is evaluated. Main controller 20 obtains RMS error $\epsilon$, between measurement result $\langle \Psi \rangle$ and reference shape $\langle\!\langle \Psi \rangle\!\rangle$. Main controller 20, by judging whether or not the obtained RMS error $\epsilon$ is within acceptable limitation $\epsilon_0$ set in step 202 or not, judges whether or not deviation of the light source shape from the target is within an acceptable range or not, namely evaluates the coinciding degree of the illumination light source shape that has been set with respect to the target light source shape. And, in the case the judgment in this step 202 is negative, the operation moves to step 212.

Incidentally, because SMO solution $\Psi_{DESIGN}(\xi,\eta)$ of the light source shape was given as reference shape $\langle\!\langle \Psi \rangle\!\rangle$ as previously described, this avoids the light source shape obtained by the OPE matching from diverging greatly from the SMO solution, and furthermore avoids the optimization flow of the OPE matching from diverging and the like.

In step 212, main controller 20, with respect to light source shape $\Psi$, makes options of modulation $\Delta\Psi$ (modulated parameters $Z_1$-$Z_i$) which give RMS error $\epsilon$ equal to or less than acceptable limitation $\epsilon_0$. As an example, an option of modulation $\Delta\Psi$ is given $\Delta\Psi=w(\langle\!\langle \Psi \rangle\!\rangle - \Psi)$, using weight 0<w<1. Weight w is set in step 202. When modulation $\Delta\Psi$ is given, main controller 20 performs expansion using the model that has been set, namely a product of the Zernike polynomials and the reference shape or a product of the distortion function and the reference shape. And, by the expansion coefficient, modulated parameters $Z_1$-$Z_i$ are obtained, and the operation returns to step 206.

Meanwhile, when judgment in step 210 is affirmed, the operation moves to step 214.

In step 214, image-forming performance, namely the line width (line width error) set in step 202 is predicted, using measurement result $\langle \Psi \rangle$ of the light source shape measured in step 208. Herein, line width (expressed as $\Delta_{CD,k}$ is predicted with respect to the $k^{th}$ type test pattern (k=1-K) set in step 202.

Incidentally, line width $\Delta_{CD,k}$ can be predicted for several focus points. Further, line width $\Delta_{CD,k}$ can be predicted for several exposure dose amounts (accurately, exposure time).

From the predictions above, prediction results of the line width similar to FIG. 8B and FIG. 8D can be obtained. From these results, deviation (line width error) from the true line width (45 nm) can be obtained. Incidentally, deviation (line width error) predicted for the $k^{th}$ type test pattern is expressed as $\langle \equiv_{CD,k} \rangle$.

In the next step 216, judgment is made of whether or not line width error $\langle \Delta_{CD,k} \rangle$ predicted in step 214 is within an acceptable range (image-forming performance is evaluated). To be concrete, main controller 20 judges whether or not average (weighting average) $\langle \Delta_{CD,AVG} \rangle$ of all the test patterns (k=1-K) of line width error $\langle \Delta_{CD,k} \rangle$ or maximum value $\langle \Delta_{CD,MAX} \rangle$ of the line width error is larger than the acceptable limitation set in step 202. And, when the judgment in this step 216 is negative, further optimization of the light source shape becomes necessary, therefore, the operation moves to step 218.

In step 218, modulated parameters $Z_1$-$Z_i$ are obtained from line width error $\langle \Delta_{CD,k} \rangle$ (k=1-K) predicted above. Main controller 20 substitutes line width error $\langle \Delta_{CD,k} \rangle$ (k=1-K) into the left-hand side of formula (11) and variation table information into each term on the right-hand side, and determines a set of coefficients $c_1$-$c_i$ that simultaneously satisfy K linear equations, using the least-squares method and the like. These coefficients $c_1$-$c_i$ give modulated parameters $Z_1$-$Z_i$. When the modulated parameters are obtained, the operation returns to step 206.

Meanwhile, when the judgment in step 216 is affirmed, namely when the predicted line width error $\langle \Delta_{CD,k} \rangle$ is judged to be within an acceptable range, the operation moves to the next step 220.

In the next step 220, test exposure is performed using a test reticle. Herein, as the test reticle, a reticle on which the $k^{th}$ type test pattern (k=1-K) is formed set in step 202 is used. Main controller 20 exposes the wafer performing the exposure operation previously described. After completing the exposure, main controller 20 carries the wafer that has been exposed to a coater-developer (C/D) which is not shown and is, for example, inline connected to exposure apparatus 100, and develops the wafer. Main controller 20 reloads the wafer that has been developed onto wafer stage WST, detects the resist image of the test pattern formed on the wafer using alignment system AS, and obtains the line width (line width error).

Incidentally, on test exposure, exposure can be performed on several focus points. Further, exposure can be performed for several exposure dose amounts (to be accurate, exposure time).

From the test exposure described above, detection results of the line width similar to FIG. 8B and FIG. 8D can be obtained. In the test exposure, because the OPE is reflected in the detection results of the line width, deviation (line width error) from the true line width (45 nm) is more noticeable. Incidentally, the deviation (line width error) obtained for the $k^{th}$ type test pattern is expressed as $\langle \Delta_{CD,k} \rangle$.

In the next step 222, judgment is made of whether or not line width error $\langle \Delta_{CD,k} \rangle$ obtained in step 220 is within an acceptable range (image-forming performance is evaluated). To be concrete, main controller 20 main controller 20 judges whether or not average (weighting average) $\langle \Delta_{CD,AVG} \rangle$ of all the test patterns (k=1-K) of line width error $\langle \Delta_{CD,k} \rangle$ or maximum line width error $\langle \Delta_{CD,MAX} \rangle$ is larger than the acceptable limitation set in step 202. In the case the line width error is larger, then further optimization of the light source shape is judged necessary, therefore, the operation moves to step 218.

In step 218, modulated parameters $Z_1$-$Z_i$ are obtained from line width error $\langle \Delta_{CD,k} \rangle$ (k=1-K) obtained above. Main controller 20 substitutes line width error $\langle \Delta_{CD,k} \rangle$ (k=1-K) into the left-hand side of formula (11) and variation table information into each term on the right-hand side, and determines a set of coefficients $c_1$-$c_i$ that simultaneously satisfy K linear equations, using the least-squares method and the like. These coefficients $c_1$-$c_i$ give modulated parameters $Z_1$-$Z_i$. When the modulated parameters are obtained, the operation returns to step 206.

Referring back to step 206, the light source shape is modulated using modulation data Δψ obtained in step 212 or 218, namely modulated parameter $\Delta Z_i$ (i=1-I). This reproduces light source shape (pupil luminance distribution) Ψ+ΔΨ which has been optimized.

Hereinafter, steps 206-220 are repeated until the judgment in step 222 is affirmed.

When the judgment in step 222 is affirmed, optimum light source shape $\Psi_{OPTIMIZED}(\epsilon,\eta)$ where line width error $\langle \Delta_{CD,k} \rangle$ (k=1-K) becomes minimum is obtained, and the OPE matching is completed. Herein, main controller 20 reports line width error $\langle \Delta_{CD,k} \rangle$ (k=1-K) corresponding to optimum light source shape $\Psi_{OPTIMIZED}(\xi,\eta)$ on the display device (not shown), and stores (saves) optimum light source shape $\Psi_{OPTIMIZED}(\xi,\eta)$ that has been obtained in storage device 42.

Main controller 20, on wafer exposure, reads optimum light source shape $\Psi_{OPTIMIZED}(\xi,\eta)$ corresponding to the mask pattern from the storage device (not shown), and based on the data, controls spatial light modulator 3S (tilt of mirror element SE), and reproduces the light source shape (pupil luminance distribution). After that, main controller 20 performs exposure operation by the step-and-scan method similar to an ordinary scanner.

Incidentally, although it is not noted in particular in the description above, in the OPE matching of the SMO solution in the present embodiment, the projection position of the test pattern to evaluate the OPE (OPE error) is decided to a plurality of positions that are different on the image-forming plane. This allows the light source shape, namely the luminance distribution in almost the entire pupil plane, to be accurately optimized on almost the entire surface within the image-forming plane.

Further, in step 220, while a test exposure was performed using the $k^{th}$ type test pattern (=1-K), and the image-forming performance (line width error) was evaluated detecting the pattern transferred onto the wafer, instead of, or together with this, the image-forming performance (line width error) can be evaluated by detecting the projection image of the $k^{th}$ type of test pattern using light detector (luminance distribution measuring instrument 80 and the like) provided on wafer stage WST, or using a spatial image measuring instrument and the like disclosed in, for example, U.S. Patent Application Publication No. 2002/0041377 and the like. Herein, the image-forming performance (line width error) should be evaluated, further taking into consideration the resist characteristics and the like.

As described in detail so far, in exposure apparatus 100 related to the present embodiment, a light source shape which is obtained as a result (SMO solution) of SMO which is a means of optimizing calculation to optimize a pattern of a mask and an illumination light source serves as a target, and a shape (light source shape) of an illumination light source is set (steps 202-212) controlling spatial light modulator 3S so that deviation from a target is within an acceptable range, and by using an illumination light from the illumination light source having the light source shape that has been set, an image of a pattern obtained as a result (SMO solution) of SMO is formed on a wafer, and by using the detection result (line width error) of the detection of the image of the pattern which has been formed as an evaluation index, OPE is evaluated (steps 220, 222) as the image-forming performance, and the light source shape is optimized (steps 222, 218) based on the evaluation results of the OPE. That is, in the present embodiment, OPE matching of the SMO solution is performed in the manner described above. This allows an optimal light source shape to be set with respect to the pattern of the reticle. Further, by using the illumination light generated by the illumination light source having the light source shape that has been set, the pattern of the reticle can be transferred onto the wafer with high resolution and also with good accuracy.

Further, in the OPE matching of the present embodiment, as a model to express modulation operation Q, the Zernike polynomials or a distortion function was employed. This makes it possible to obtain a desired light source shape by efficiently and accurately modulating the light source shape realized by spatial light modulator 3S having a large number of degrees of freedom, using a small number of degrees of freedom which corresponds to the number of terms in the Zernike polynomials or distortion function.

Incidentally, in the embodiment described above, if a light source shape can be suitably expressed, not only can the Zernike polynomials or distortion function be used, but an arbitrary polynomial can be used as well. Further, while the Zernike polynomials and distortion function were given in FIG. 10 and FIG. 11, a polynomial excluding a part of such terms can also be used.

Incidentally, in the OPE matching in the embodiment described above, while an example of a modulation using two models using the Zernike polynomials and distortion function was described, in a similar manner, modulation using blurring effect is also possible. Pupil luminance distribution Ψ(ξ,η) including blurring effect, can be obtained as a convolution (convolution) of an initially wanted pupil luminance distribution $\Psi_{DESIGN}(\xi,\eta)$ and a blur function (point spread function) B(ξ,η) expressing the luminance distribution of blur, as in $\Psi(\xi,\eta)=(\Psi_{DESIGN}\cdot B)*(\xi,\eta)$. Function B, for example, is given by a gauss function having a width σ. Convolution can be rewritten by a Fourier transform into a similar form as $F(\Psi)=F(\Psi_{DESIGN})F(B)$ and formula (2a), and F(B) indicating modulation can be rewritten to a similar form (gauss function) as formula (2b). Accordingly, in a similar manner as the OPE matching, a width σ that minimizes the blurring effect is obtained, and the light source shape can be modulated. Further, a flare component can also be used. Modulation of the flare component is expressed by a DC component within the exponent on the right-hand side of formula (2b). Accordingly, in a similar manner as the OPE matching, the DC component value that minimizes the flare component is obtained, and the light source shape can also be modulated.

Further, in the embodiment described above, in steps 214 and 216, the image-forming performance (as an example, line width error which is an evaluation index of the OPE error) was predicted using measurement result $\langle\Psi\rangle$ of the light source shape measured in step 208, and judgment (evaluating the image-forming performance) was made of whether or not the predicted line width error $\langle\Delta_{CD,k}\rangle$ was within an acceptable range, and furthermore, in steps 220 and 222, the test pattern was transferred on the wafer by actual exposure and line width error (evaluation index of the OPE error) of the resist image of the test pattern which was obtained after developing the wafer was actually measured, and judgment was made of whether or not line width error $\langle\Delta_{CD,k}\rangle$ which was actually measured was within an acceptable range. However, as well as this, either of steps 214 and 216, and steps 220 and 222, such as, for example, the processing in steps 214 and 216 can be omitted.

Further, in the embodiment described above, while the case has been described where the line width (line width error) of the pattern is used as an evaluation index of the OPE error, as well as this, the OPE error can also be evaluated, using image-forming performance other than the line width error, or a combination of a plurality of image-forming performances as the evaluation index.

Further, in the embodiment described above, the OPE matching was picked as an example of image-forming performance matching of the SMO solution. And, while the OPE variation table was used as the variation table of image-forming performance, and line width (line width error) of the pattern which is one of the evaluation indexes of the OPE error was used as the evaluation index of image-forming performance, respectively, the present invention is not limited to this. That is, matching of the image-forming performance of the SMO solution is not limited to the OPE, and for example, image-forming performance such as distortion of the projection image can also be subject to matching of the image-forming performance of the SMO solution, and the corresponding variation table of the image-forming performance and the evaluation index of the image-forming performance can be used. Further, a plurality of image-forming performances can be subject to the matching of the SMO solution.

Further, in exposure apparatus 100 related to the present embodiment, while the structure was employed where the pupil luminance distribution was measured on the wafer surface using luminance distribution measuring instrument 80 provided on wafer stage WST, the structure where luminance distribution measuring instrument 80 is provided on reticle stage RST, and the pupil luminance distribution is measured on the pattern surface of the reticle can also be employed. In this case, because effect of the optical properties of projection optical system PL is not included in the measurement results of the pupil luminance distribution, this structure is suitable for precisely measuring the pupil luminance distribution.

Incidentally, in the present embodiment, while main controller 20 executed the OPE matching of the SMO solution, the host computer or an exclusive computer connected to the device manufacturing system can also execute the OPE matching of the SMO solution, and main controller 20 can perform test exposure, light source shape measurement and the like under the instructions of such systems.

Incidentally, in exposure apparatus 100 of the present embodiment, while one spatial light modulating unit (spatial light modulator) was used, it is also possible to use a plurality of spatial light modulating units (spatial light modulator). As an illumination optical system for an exposure apparatus using a plurality of spatial light modulating units, the illumination optical system disclosed in, for example, U.S. Patent Application Publication No. 2009/0109417 and U.S. Patent Application Publication No. 2009/0128886 can be employed.

Further, in exposure apparatus 100 of the present embodiment, while a spatial light modulator is employed which independently controls the tilt of mirror elements that are arrayed two-dimensionally, as such a spatial light modulator, a spatial light modulator whose details are disclosed in, for example, European Patent Application No. 779530, U.S. Pat. No. 6,900,915, and U.S. Pat. No. 7,095,546 and the like can be employed.

Further, as the spatial light modulator, it is possible to employ a spatial light modulator whose height of the mirror elements can further be controlled independently. As such a spatial light modulator, a spatial light modulator whose details are disclosed in, for example, U.S. Pat. No. 5,312,513, and U.S. Pat. No. 6,885,493 can be employed. Furthermore, it is also possible to modify the spatial light modulator described above according to, for example, U.S. Pat. No. 6,891,655, and U.S. Patent Application Publication No. 2005/0095749.

Further, in the embodiment described above, while the case has been described where the exposure apparatus is a scanning stepper, as well as this, the embodiment described above can also be applied to a static type exposure apparatus such as a stepper. Further, the embodiment described above can also be applied to a reduction projection exposure apparatus using a step-and-stitch method which synthesizes a shot area and a shot area.

Further, the embodiment described above can also be applied to a multi-stage type exposure apparatus equipped with a plurality of wafer stages, as is disclosed in, for example, U.S. Pat. Nos. 6,590,634, 5,969,441, 6,208,407 and the like. Further, as disclosed in, for example, U.S. Pat. No. 7,589,822, the embodiment described above can also be applied to an exposure apparatus equipped with a measurement stage including measurement members (for example, a reference mark, and/or a sensor) apart from the wafer stage.

Incidentally, in the embodiment described above, while the case has been described where the exposure apparatus was a dry type exposure apparatus that performs exposure of wafer W without liquid (water), as well as this, as is disclosed in, for example, EP Patent Application Publication No. 1,420,298, PCT International Publication No. 2004/055803, the embodiment described above can also be applied to an exposure apparatus which has a liquid immersion space including an optical path of the illumination light between a projection optical system and a wafer, and exposes the wafer with the illumination light via the projection optical system and the liquid in the liquid immersion space.

Further, the magnification of the projection optical system in the exposure apparatus in the embodiment above is not only a reduction system, but also can be either an equal magnifying or a magnifying system, and the projection optical system is not only a dioptric system, but also can be either a catoptric system or a catadioptric system, and the projection image can be either an inverted image or an erected image.

Further, in the embodiment described above, a so-called polarized illumination method can be applied whose details are disclosed in, for example, U.S. Patent Application Publication No. 2006/0170901, and U.S. Patent Application Publication No. 2007/0146676.

Further, the light source of the exposure apparatus is not limited to the ArF excimer laser, and a pulse laser light source such as a KrF excimer laser (output wavelength: 248 nm), an $F_2$ laser (output wavelength: 157 nm), an $Ar_2$ laser (output wavelength: 126 nm) or a $Kr_2$ laser (output wavelength: 146 nm), or an extra-high pressure mercury lamp that generates an emission line such as a g-line (wavelength: 436 nm), an i-line (wavelength: 365 nm) and the like can also be used. Further, a harmonic generator of a YAG laser can also be used. Besides this, as disclosed in, for example, U.S. Pat. No. 7,023,610, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytterbium), and by converting the wavelength into ultraviolet light using a nonlinear optical crystal, can also be used.

Further, as disclosed in, for example, PCT International Publication No. 2001/035168, an exposure apparatus (lithography system) which forms a line and space pattern on wafer W by forming interference fringes on wafer W can be employed as exposure apparatus 110.

Furthermore, as disclosed in, for example, U.S. Pat. No. 6,611,316, an exposure apparatus which synthesizes two reticle patterns on the wafer via the projection optical system, and substantially simultaneously performs double exposure on one shot area on a wafer by one scanning exposure can be employed as exposure apparatus 110.

Incidentally, the object (object subject to exposure on which an energy beam is irradiated) on which a pattern is to be formed in the embodiment described above is not limited to a wafer, and can be other objects such as glass plates, ceramic substrates, film members, or mask blanks and the like.

The use of the exposure apparatus is not limited only to the exposure apparatus for manufacturing semiconductor devices, but the present invention can also be widely applied to an exposure apparatus for transferring a liquid crystal display device pattern onto a rectangular glass plate and an exposure apparatus for producing organic ELs, thin-film magnetic heads, imaging devices (such as CCDs), micromachines, DNA chips, and the like. Further, the embodiment above can also be applied to an exposure apparatus that transfers a circuit pattern onto a glass substrate, a silicon wafer or the like not only when producing microdevices such as semiconductor devices, but also when producing a reticle or a mask used in an exposure apparatus such as an optical exposure apparatus, an EUV exposure apparatus, an X-ray exposure apparatus, and an electron beam exposure apparatus.

Electronic devices such as semiconductor devices are manufactured through the steps of; a step where the function/performance design of the device is performed, a step where a reticle based on the design step is manufactured, a step where a wafer is manufactured from silicon materials, a lithography step where the pattern of a mask (reticle) is transferred onto the wafer by the exposure apparatus (pattern formation apparatus) making up apart of the lithography system and the exposure method in the embodiment previously described, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, because the exposure method previously described is executed using the exposure apparatus making up a part of the lithography system of the embodiment described above in the lithography step, and a device pattern is formed on the wafer, highly integrated devices can be produced with good productivity.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. An adjustment device used in an exposure apparatus that makes a light from a light source be distributed in an illumination pupil, illuminates a pattern with the light via the illumination pupil and exposes an object with an image of the pattern that has been illuminated, the device comprising:
    a memory in which instructions are stored; and
    a controller configured to execute the instructions stored in the memory causing the controller to execute:
        expressing, by using a polynomial, a distribution of difference between a pupil intensity distribution in the illumination pupil and a target pupil intensity distribution serving as a target; and
        calculating, by using a variation of an image-forming state measured after forming the image of the pattern on the object, a coefficient of each term of the polynomial such that the image-forming state falls within a predetermined acceptable range, wherein
        the controller outputs an instruction for adjusting the pupil intensity distribution by using the coefficient obtained by the calculating.

2. The adjustment device according to claim 1, wherein the controller executes the expressing and the calculating, with the adjusted pupil intensity distribution serving as the pupil intensity distribution.

3. The adjustment device according to claim 1, wherein the polynomial comprises a polynomial in which a position in the illumination pupil is used as a variable.

4. The adjustment device according to claim 3, wherein the polynomial comprises a transmittance modulation function $T(\xi,\eta) \equiv \exp[\Sigma_i Z_i f_i(\xi,\eta)]$ defined using a Fringe Zernike polynomial $f_i(\xi\eta)$ related to a position $\xi,\eta$ in the illumination pupil and an expansion coefficient $Z_i$, of each order of the Fringe Zernike polynomial.

5. The adjustment device according to claim 3, wherein the polynomial comprises a distortion polynomial $\xi'=\Sigma_i Z'_i\{D_i(\xi,\eta)\cdot D\xi\}, \eta'=\Sigma_i Z'_i\{D_i(\xi,\eta)\cdot D\eta\}$.

6. The adjustment device according to claim 1, wherein in the calculating, a least-squares method is used.

7. The adjustment device according to claim 1, wherein the image-forming state includes an error of a line width of the image of the pattern.

8. The adjustment device according to claim 1, wherein the image-forming state includes an Optical Proximity Effect error.

9. The adjustment device according to claim 1, wherein the image-forming state includes a process window.

10. The adjustment device according to claim 1, wherein the polynomial includes a polynomial that is a Zernike polynomial multiplied by the target pupil intensity distribution.

11. The adjustment device according to claim 1, wherein the polynomial includes a polynomial that is a distortion polynomial multiplied by the target pupil intensity distribution.

12. The adjustment device according to claim 1, wherein the polynomial includes a convolution of a blur function that indicates an intensity distribution of blur and the target pupil intensity distribution.

13. The adjustment device according to claim 1, wherein the polynomial includes a predetermined index function related to a modulation due to a flare component.

14. A device manufacturing method comprising:
forming a predetermined pattern on a substrate serving as the object, using an exposure apparatus adjusted with the adjustment device according to claim 1;
developing the substrate on which the predetermined pattern has been formed and forming a mask layer on a surface of the substrate, the mask layer having a shape corresponding to the predetermined pattern; and
processing the surface of the substrate via the mask layer.

15. A non-transitory computer-readable recording medium storing a program that causes a computer to execute at least a part of control of an exposure apparatus, the exposure apparatus making a light from a light source be distributed in an illumination pupil, illuminating a pattern with the light via the illumination pupil and exposing an object with an image of the pattern that has been illuminated, the program causing the computer to execute:
by using a polynomial, expressing a distribution of difference between a pupil intensity distribution in the illumination pupil and a target pupil intensity distribution that serves as a target; and
by using a variation of an image-forming state measured after forming the image of the pattern on the object, calculating a coefficient of each term of the polynomial such that the image-forming state falls within a predetermined acceptable range.

16. The non-transitory computer-readable recording medium according to claim 15, wherein
the polynomial comprises a polynomial in which a position in the illumination pupil is used as a variable.

17. The non-transitory computer-readable recording medium according to claim 16, wherein
the polynomial comprises a transmittance modulation function $T(\xi,\eta) \equiv \exp[\Sigma_i Z_i f_i(\xi,\eta)]$ defined using a Fringe Zernike polynomial $f_i(\xi,\eta)$ related to a position $\xi,\eta$ in the illumination pupil and an expansion coefficient $Z_i$ of each order of the Fringe Zernike polynomial.

18. The non-transitory computer-readable recording medium according to claim 16, wherein
the polynomial comprises a distortion polynomial $\xi' = \Sigma_i Z'_i \{D_i(\xi,\eta) \cdot D\xi\}, \eta' = \Sigma_i Z'_i \{D_i(\xi,\eta) \cdot D\eta\}$.

19. The non-transitory computer-readable recording medium according to claim 15, wherein
the image-forming state includes an error of a line width of the image of the pattern.

20. The non-transitory computer-readable recording medium according to claim 15, wherein
the image-forming state includes an Optical Proximity Effect error.

21. The non-transitory computer-readable recording medium according to claim 15, wherein
the image-forming state includes a process window.

22. The non-transitory computer-readable recording medium according to claim 15, wherein
the polynomial includes a polynomial that is a Zernike polynomial multiplied by the target pupil intensity distribution.

23. The non-transitory computer-readable recording medium according to claim 15, wherein
the polynomial includes a polynomial that is a distortion polynomial multiplied by the target pupil intensity distribution.

24. The non-transitory computer-readable recording medium according to claim 15, wherein
the polynomial includes a convolution of a blur function that indicates an intensity distribution of blur and the target pupil intensity distribution.

25. The non-transitory computer-readable recording medium according to claim 15, wherein
the polynomial includes a predetermined index function related to a modulation due to a flare component.

26. An exposure apparatus that makes a light from a light source be distributed in an illumination pupil, illuminates a pattern with the light via the illumination pupil and exposes an object with an image of the pattern that has been illuminated, the apparatus comprising:
a first calculation section that, by using a polynomial, expresses a distribution of difference between a pupil intensity distribution in the illumination pupil and a target pupil intensity distribution that serves as a target;
a second calculation section that, by using a variation of an image-forming state measured after forming the image of the pattern on the object, calculates a coefficient of each term of the polynomial such that the image-forming state falls within a predetermined acceptable range; and
an adjustment section that adjusts the pupil intensity distribution, by using the coefficient that has been calculated.

27. The exposure apparatus according to claim 26, wherein
the polynomial comprises a polynomial in which a position in the illumination pupil is used as a variable.

28. The exposure apparatus according to claim 27, wherein the polynomial comprises a transmittance modulation function $T(\xi,\eta) \equiv \exp[\Sigma_i Z_i f_i(\xi,\eta)]$ defined using a Fringe Zernike polynomial $f_i(\xi,\eta)$ related to a position $\xi,\eta$ in the illumination pupil and an expansion coefficient $Z_i$ of each order of the Fringe Zernike polynomial.

29. The exposure apparatus according to claim 27, wherein
the polynomial comprises a distortion polynomial $\xi' = \Sigma_i Z'_i \{D_i(\xi,\eta) \cdot D\xi\}, \eta' = \Sigma_i Z'_i \{D_i(\xi,\eta) \cdot D\eta\}$.

30. The exposure apparatus according to claim 26, wherein
the image-forming state includes an error of a line width of the image of the pattern.

31. The exposure apparatus according to claim 26, wherein
the image-forming state includes an Optical Proximity Effect error.

32. The exposure apparatus according to claim 26, wherein
the image-forming state includes a process window.

33. The exposure apparatus according to claim 26, wherein
the polynomial includes a polynomial that is a Zernike polynomial multiplied by the target pupil intensity distribution.

34. The exposure apparatus according to claim 26, wherein
the polynomial includes a polynomial that is a distortion polynomial multiplied by the target pupil intensity distribution.

35. The exposure apparatus according to claim 26, wherein
the polynomial includes a convolution of a blur function that indicates an intensity distribution of blur and the target pupil intensity distribution.

36. The exposure apparatus according to claim 26, wherein
the polynomial includes a predetermined index function related to a modulation due to a flare component.

37. A lithography system that forms a pattern on a substrate, the system comprising:
the exposure apparatus according to claim 26; and
a controller that performs at least a part of control of the exposure apparatus.

38. A device manufacturing method comprising:
forming a predetermined pattern on a substrate serving as the object, using the lithography system according to claim 37;
developing the substrate on which the predetermined pattern has been formed and forming a mask layer on a surface of the substrate, the mask layer having a shape corresponding to the predetermined pattern; and
processing the surface of the substrate via the mask layer.

* * * * *